(12) United States Patent
Hwang

(10) Patent No.: US 11,682,670 B2
(45) Date of Patent: Jun. 20, 2023

(54) INTEGRATED CIRCUIT DEVICE AND METHOD OF MANUFACTURING THE SAME

(71) Applicant: Samsung Electronics Co., Ltd., Suwon-si (KR)

(72) Inventor: Seungju Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/554,447

(22) Filed: Dec. 17, 2021

(65) Prior Publication Data

US 2022/0108982 A1    Apr. 7, 2022

Related U.S. Application Data

(62) Division of application No. 16/840,662, filed on Apr. 6, 2020, now Pat. No. 11,233,051.

(30) Foreign Application Priority Data

Oct. 2, 2019  (KR) .......................... 10-2019-0122407

(51) Int. Cl.
*H01L 27/088* (2006.01)
*H01L 29/423* (2006.01)
*H01L 23/535* (2006.01)
*H01L 21/8234* (2006.01)
*H01L 29/08* (2006.01)
(Continued)

(52) U.S. Cl.
CPC .. *H01L 27/0886* (2013.01); *H01L 21/823418* (2013.01); *H01L 21/823431* (2013.01); *H01L 21/823456* (2013.01); *H01L 21/823475* (2013.01); *H01L 21/823481* (2013.01); *H01L 23/535* (2013.01); *H01L 29/0653* (2013.01); *H01L 29/0847* (2013.01); *H01L 29/42376* (2013.01); *H01L 29/66545* (2013.01)

(58) Field of Classification Search
CPC ......... H01L 21/823418; H01L 29/7855; H01L 29/0847; H01L 29/0653; H01L 29/42376; H01L 21/823431; H01L 27/0886
See application file for complete search history.

(56) References Cited

U.S. PATENT DOCUMENTS

| 7,348,642 | B2 | 3/2008 | Nowak |
| 8,809,947 | B1 | 8/2014 | Akarvardar et al. |
| 9,171,752 | B1 * | 10/2015 | Wu ................... H01L 21/76224 |

(Continued)

*Primary Examiner* — Changhyun Yi
(74) *Attorney, Agent, or Firm* — Harness, Dickey & Pierce, P.L.C.

(57) ABSTRACT

An integrated circuit device including a pair of first fin type active areas protruding from a substrate in a vertical direction and extending in parallel with each other, a gate interposed between the pair of first fin type active areas, spaced apart from each of the pair of first fin type active areas in a first horizontal direction, and longitudinally extending in parallel with the pair of first fin type active areas, a gate insulating layer filling a first space between one of the pair of first fin type active areas and the gate and a second space between the other of the pair of first fin type active areas and the gate, and a pair of source/drain areas at both sides of the gate, respectively, in a second horizontal direction perpendicular to the first horizontal direction and on the pair of first fin type active areas may be provided.

10 Claims, 32 Drawing Sheets

(51) Int. Cl.
    *H01L 29/66*         (2006.01)
    *H01L 29/06*         (2006.01)

(56) References Cited

U.S. PATENT DOCUMENTS

| | | |
|---|---|---|
| 9,276,088 B1 * | 3/2016 | Singh .............. H01L 21/823431 |
| 9,520,396 B2 | 12/2016 | Singh |
| 9,768,293 B1 | 9/2017 | Syue et al. |
| 10,312,367 B2 | 6/2019 | Phoa et al. |
| 2013/0187237 A1 | 7/2013 | Yu et al. |
| 2017/0207217 A1 | 7/2017 | Hellings et al. |
| 2017/0373061 A1 | 12/2017 | Cheng et al. |
| 2018/0226432 A1 | 8/2018 | Hafez et al. |

\* cited by examiner

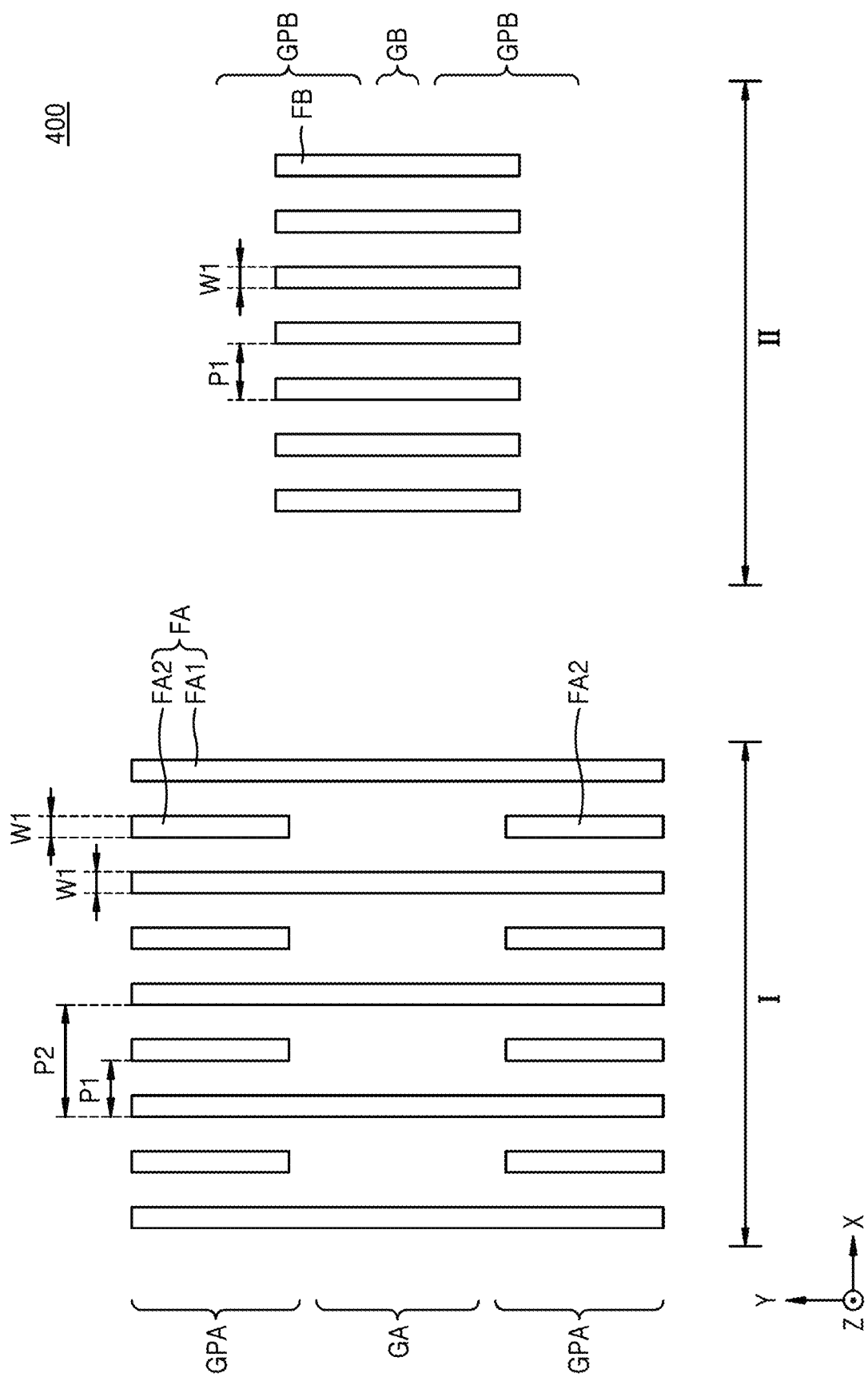

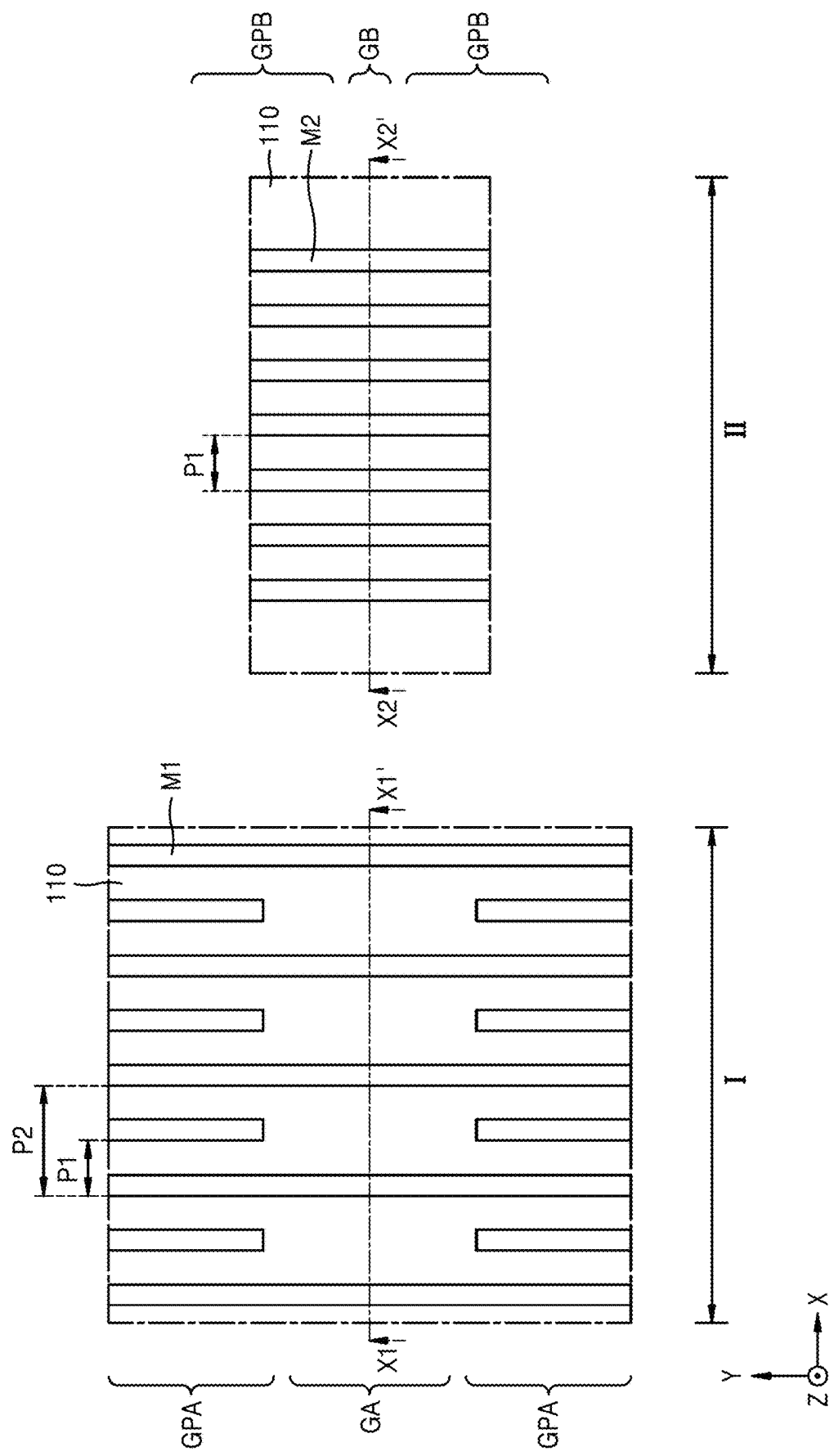

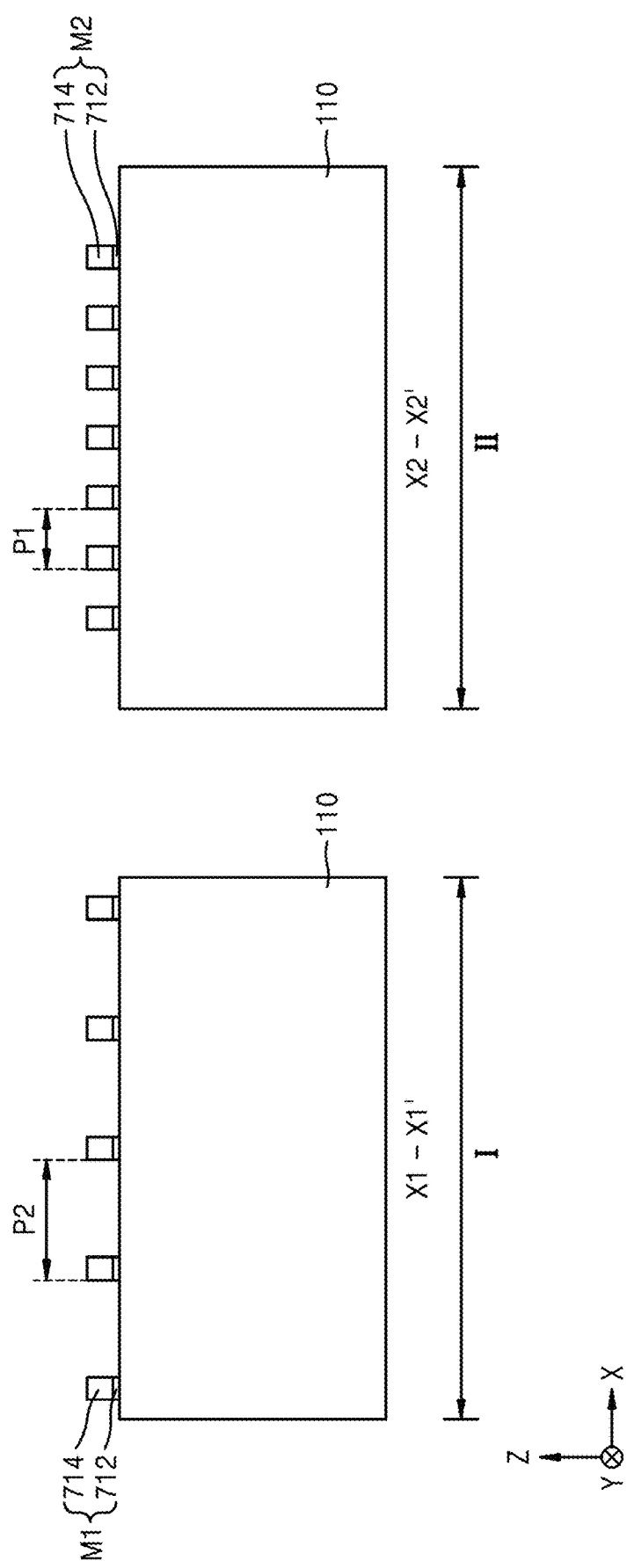

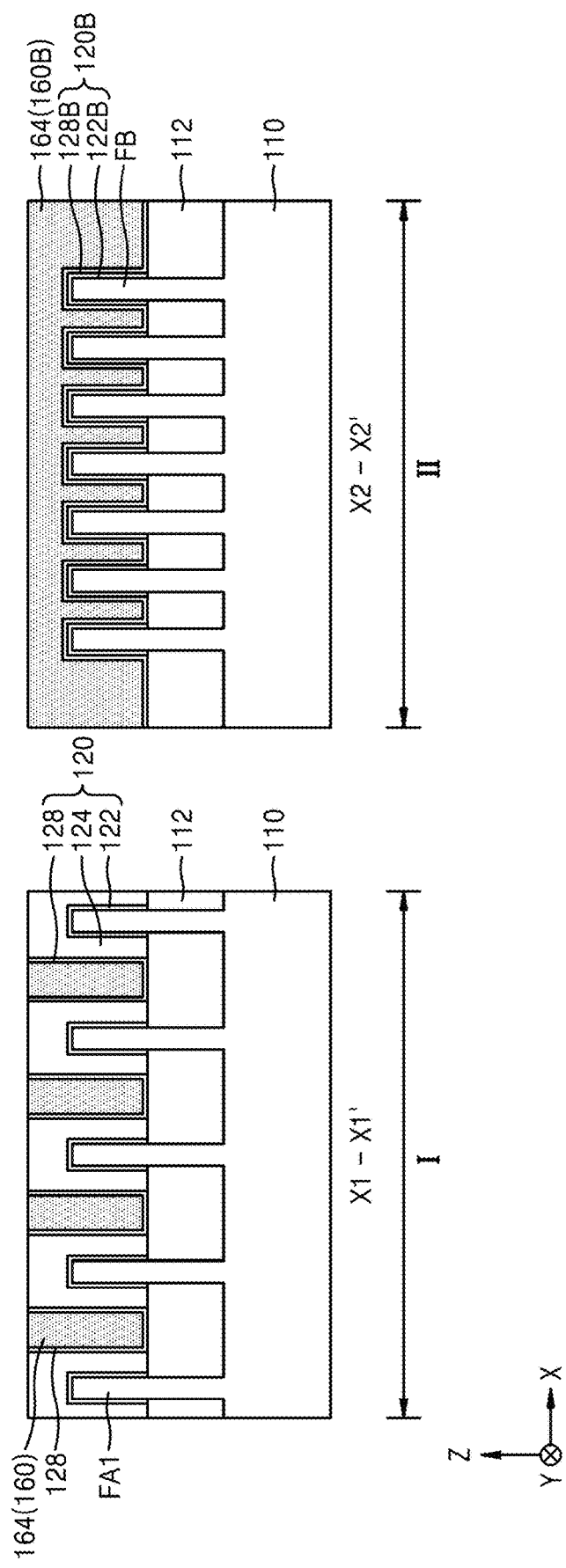

INTEGRATED CIRCUIT DEVICE AND METHOD OF MANUFACTURING THE SAME

CROSS-REFERENCE TO RELATED APPLICATION

This application is a divisional of U.S. application Ser. No. 16/840,662, filed on Apr. 6, 2020, which claims priority under 35 U.S.C. § 119 to Korean Patent Application No. 10-2019-0122407, filed on Oct. 2, 2019, in the Korean Intellectual Property Office, the disclosure of each of which is incorporated herein in its entirety by reference.

BACKGROUND

The inventive concepts relate to integrated circuit devices and/or methods of manufacturing the same, and more particularly, to integrated circuit devices including a fin type active area and/or methods of manufacturing the same.

Due to the development of electronic technology, recently, down-scaling of semiconductor devices is proceeding rapidly. Recently, since a semiconductor device requires not only a high operating speed but also accuracy regarding an operation, various studies on optimization of a structure of a transistor included in the semiconductor device are being conducted.

SUMMARY

The inventive concepts provide integrated circuit devices having a structure for obtaining optimized or desired performance in accordance with a magnitude of an operating voltage of a transistor.

The inventive concepts provide methods of manufacturing an integrated circuit device having a structure for obtaining optimized or desired performance in accordance with a magnitude of an operating voltage of a transistor.

According to an example embodiment of the inventive concepts, an integrated circuit device may include a pair of first fin type active areas protruding from a substrate in a vertical direction and extending in parallel with each other, a gate between the pair of first fin type active areas, the gate apart from each of the pair of first fin type active areas in a first horizontal direction, and the gate longitudinally extending to run parallel with the pair of first fin type active areas, a gate insulating layer filling a first space between one of the pair of first fin type active areas and the gate and a second space between the other of the pair of first fin type active areas and the gate, and a pair of source/drain areas at both sides of the gate, respectively, in a second horizontal direction, each of the pair of source/drain areas being on the pair of first fin type active area, the second horizontal direction being perpendicular to the first horizontal direction.

According to an example embodiment of the inventive concepts, an integrated circuit device may include a plurality of first fin type active areas protruding from a substrate in a first area of the substrate in a vertical direction, the plurality of first fin type active areas arranged in a first horizontal direction, a plurality of gates between the plurality of first fin type active areas one by one, the gates longitudinally extending in a second horizontal direction perpendicular to the first horizontal direction, a gate insulating layer filling spaces between the plurality of first fin type active areas and the plurality of gates, the gate insulating layer covering an upper surface of each of the plurality of first fin type active areas, and a pair of source/drain areas at both sides of each of the plurality of gates, respectively, in the second horizontal direction, each of the pair of source/drain areas being on the plurality of first fin type active areas.

According to an example embodiment of the inventive concepts, an integrated circuit device may include forming a pair of first fin type active areas protruding from a substrate in a gate area and a gate peripheral area included in a first area of the substrate, a second fin type active area between the pair of first fin type active areas in the gate peripheral area, a gate between the pair of first fin type active areas in the gate area, the gate longitudinally extending in a length direction of the pair of first fin type active areas, and the gate spaced apart from each of the pair of first fin type active areas in a first horizontal direction, a first area gate insulating layer filling a first space between one of the pair of first fin type active areas and the gate and a second space between the other of the pair of first fin type active areas and the gate, a pair of first source/drain areas at both sides of the gate in a second horizontal direction perpendicular to the first horizontal direction, each of the pair of first source/drain areas being on the pair of first fin type active areas and the second fin type active area, a third fin type active area protruding from the substrate in a second area of the substrate, a gate line extending on the third fin type active area in an intersecting direction that intersects the third fin type active area, the gate line overlapping the third fin type active area in a vertical direction perpendicular to the first horizontal direction and the second horizontal direction, a second area gate insulating layer between the third fin type active area and the gate line, and a pair of second source/drain areas at both sides of the gate line, respectively, on the third fin type active area.

According to an example embodiment of the inventive concepts, a method of manufacturing an integrated circuit device may include a pair of fin type active areas to be spaced apart from each other on a substrate in a first horizontal direction, to be parallel with each other, and to extend in a second horizontal direction perpendicular to the first horizontal direction, forming a device isolation layer between the pair of fin type active areas and to cover lower side walls of each of the pair of fin type active areas, forming a dummy pattern to be spaced apart from the pair of fin type active areas on the device isolation layer in the first horizontal direction, to be between the pair of fin type active areas, and to longitudinally extend in parallel with the pair of fin type active areas, forming a gap-fill gate insulating layer filling a first space between one of the pair of fin type active areas and the dummy pattern and a second space between the other of the pair of fin type active areas and the dummy pattern, removing the dummy pattern, and forming a gate that longitudinally extends and runs in parallel with the pair of fin type active areas in a space from which the dummy pattern has been removed.

According to an example embodiment of the inventive concepts, a method of manufacturing an integrated circuit device includes forming a plurality of fin type active areas apart from each other in a gate area and a gate peripheral area of a substrate in a first horizontal direction, forming a device isolation layer between the plurality of fin type active areas to cover lower side walls of each of the plurality of fin type active areas on the substrate, forming a dummy line to cover the plurality of fin type active areas and the device isolation layer, in the gate area, forming a pair of source/drain areas at both sides of the dummy line, respectively, to be connected to the plurality of fin type active areas, in the gate peripheral area, forming a plurality of dummy patterns to be spaced apart from the plurality of fin type active areas in the first horizontal direction, and to be arranged between the plurality of fin type active areas one by one are formed by removing a part of the dummy line, forming a gap-fill gate insulating layer filling spaces between the plurality of fin type active areas and the plurality of dummy patterns, exposing the gap-fill gate insulating layer through the spaces from which the plurality of dummy patterns has been removed by removing the plurality of dummy patterns, and forming a plurality of gates to longitudinally extend in parallel with the plurality of fin type active areas, in the spaces from which the plurality of dummy patterns has been removed.

BRIEF DESCRIPTION OF THE DRAWINGS

Example embodiments of the inventive concepts will be more clearly understood from the following detailed description taken in conjunction with the accompanying drawings in which:

FIG. 4C is a plan view illustrating a plurality of fin type active areas in a first area and a plurality of third fin type active areas in a second area of the integrated circuit device of FIG. 4A;

FIGS. 9A to 17B are views illustrating a method of manufacturing an integrated circuit device in a process order according to an example embodiment of the inventive concepts, wherein FIGS. 9A, 10A, . . . , 17A are plan views illustrating a method of manufacturing an integrated circuit device in the process order according to an example embodiment of the inventive concepts, and FIGS. 9B, 10B to 17B are cross-sectional views illustrating some components taken along lines X1-X1' and X2-X2' of FIGS. 9A, 10A, . . . , 17A according to an example embodiment of the inventive concepts.

DETAILED DESCRIPTION

Figure 1A:
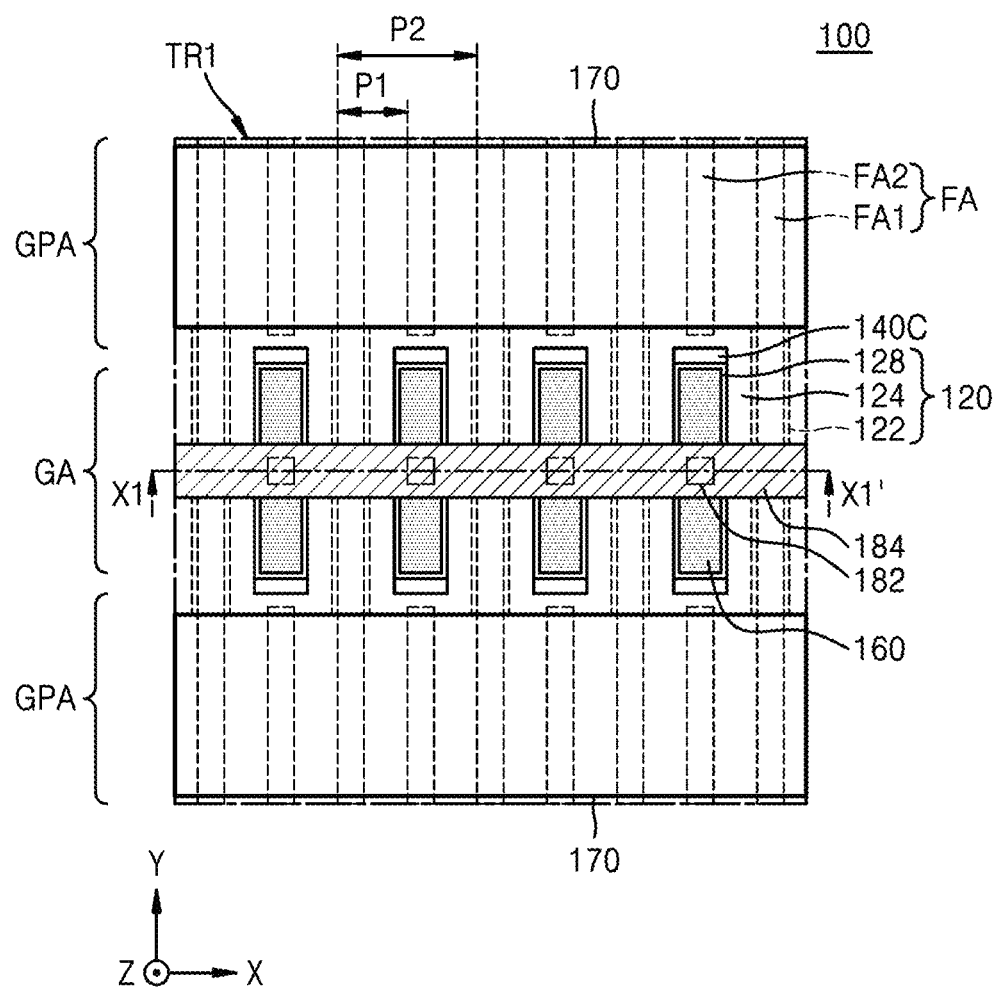
FIG. 1A is a plan view illustrating some components of an integrated circuit device according to an example embodiment of the inventive concepts.

Hereinafter, some example embodiments of the inventive concepts will be described in detail with reference to the accompanying drawings. Like reference numerals refer to like elements throughout.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1B:
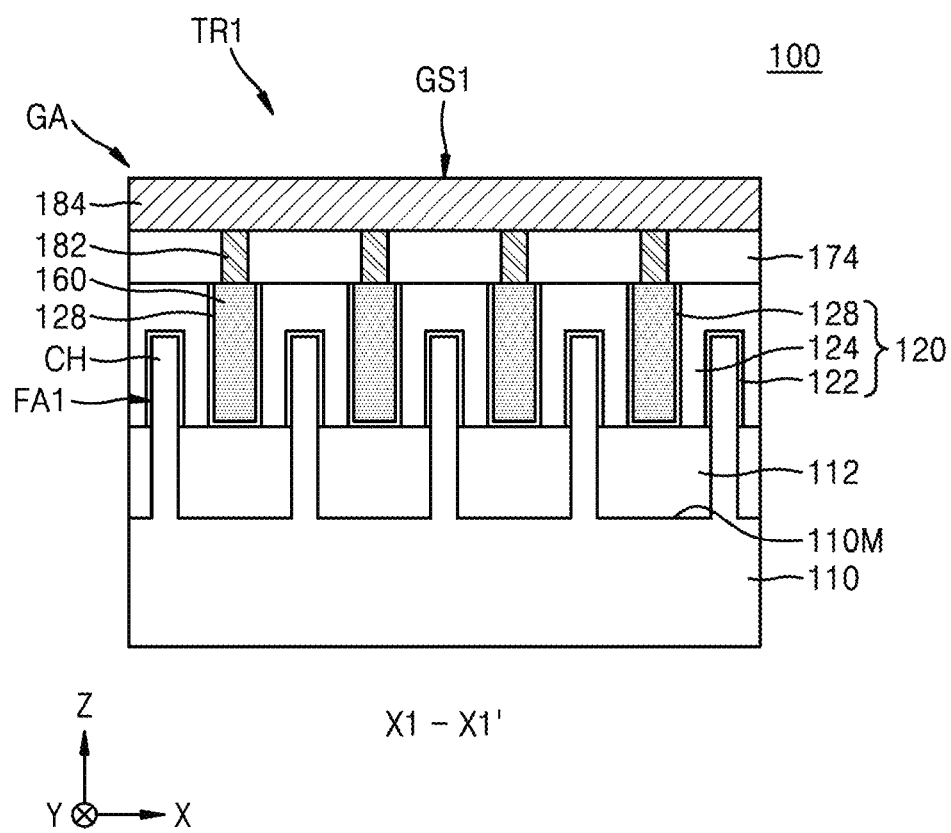
FIG. 1B is a cross-sectional view illustrating some components taken along a line X1-X1' of FIG. 1A.
Figure 1C:
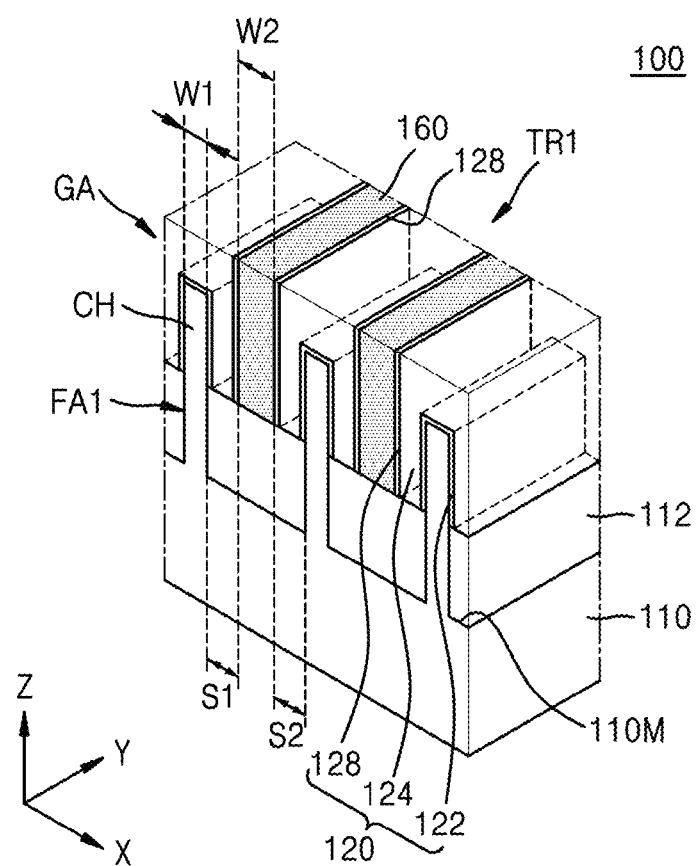
FIG. 1C is a perspective view illustrating some components of the integrated circuit device of FIG. 1A.

FIGS. 1A to 1C are views illustrating an integrated circuit device 100 according to an example embodiment of the inventive concepts of the inventive concepts. FIG. 1A is a plan view illustrating some components of an integrated circuit device 100, FIG. 1B is a cross-sectional view illustrating some components taken along a line X1-X1' of FIG. 1A, and FIG. 1C is a perspective view illustrating some components of the integrated circuit device 100.

Referring to FIGS. 1A to 1C, the integrated circuit device 100 includes a transistor TR1 implemented on a substrate 110. On the substrate 110, in an area in which the transistor TR1 is formed, a plurality of fin type active areas FA protrude from a main surface 110M of the substrate 110 in a vertical direction (a Z direction) that is a normal direction with respect to the main surface 110M. The transistor TR1 may include a plurality of gates 160 formed on the substrate 110 and a pair of source/drain areas 170 arranged at each of both sides of the plurality of gates 160. The plurality of gates 160 may be arranged in line in a gate area GA on the substrate 110 in a first horizontal direction (an X direction). The pair of source/drain areas 170 may be arranged in a gate peripheral area GPA at both sides in a second horizontal direction (a Y direction) perpendicular to the first horizontal direction (the X direction) around (e.g., above and below) the gate area GA.

The plurality of fin type active areas FA may include a plurality of first fin type active areas FA1 and a plurality of second fin type active areas FA2. The plurality of first fin type active areas FA1 may longitudinally extend over the gate area GA and the gate peripheral areas GPA at both sides of the gate area GA in the Y direction. The plurality of second fin type active areas FA2 are not arranged in the gate area GA and may be arranged only in the gate peripheral area GPA. In the Y direction, a length of each of the plurality of second fin type active areas FA2 may be less than that of each of the plurality of first fin type active areas FA1.

In the gate peripheral area GPA, the plurality of first fin type active areas FA1 and the plurality of second fin type active areas FA2 may be alternately arranged one by one in the X direction. In the gate peripheral area GPA, the plurality of fin type active areas FA, including the plurality of first fin type active areas FA1 and the plurality of second fin type active areas FA2, may be arranged in the X direction with a first pitch P1. In the gate area GA, the plurality of first fin type active areas FA1 may be arranged with a second pitch P2, which is, for example, twice the first pitch P1.

The substrate 110 may include a semiconductor such as silicon (Si) or germanium (Ge) or a compound semiconductor such as SiGe, SiC, GaAs, InAs, or InP. In another example, the substrate 110 may have a silicon on insulator (SOI) structure. The substrate 110 may include a conductive area, for example, a well doped with impurities or a structure doped with impurities. The plurality of fin type active areas FA may be obtained by etching a part of the substrate 110 and thus may be formed of the same material as the substrate 110.

The plurality of gates 160 may be arranged between the plurality of first fin type active areas FA1 one by one in the gate area GA. The plurality of gates 160 may longitudinally extend to run parallel with the plurality of first fin type active areas FA1 in the Y direction.

Each of the plurality of gates 160 may have a structure in which a metal nitride layer, a metal layer, a conductive capping layer, and a gap-fill metal layer are sequentially stacked. The metal nitride layer and the metal layer may include at least one selected from titanium (Ti), tantalum (Ta), tungsten (W), ruthenium (Ru), niobium (Nb), molybdenum (Mo), and hafnium (Hf). The gap-fill metal layer may be formed of a W layer or an aluminum (Al) layer. Each of the plurality of gates 160 may include a work function metal containing layer. The work function metal containing layer may include at least one selected from Ti, W, Ru, Nb, Mo, Hf, nickel (Ni), cobalt (Co), platinum (Pt), ytterbium (Yb), terbium (Tb), dysprosium (Dy), erbium (Er), and palladium (Pd). In some example embodiments, each of the plurality of gates 160 may include a stacked structure of TiAlC/TiN/W, a stacked structure of TiN/TaN/TiAlC/TiN/W, or a stacked structure of TiN/TaN/TiN/TiAlC/TiN/W. However, the inventive concepts are not limited thereto.

In the X direction, each of the plurality of first fin type active areas FA1 and the plurality of second fin type active areas FA2 has a first width W1 and each of the plurality of gates 160 may have a second width W2 greater than the first width W1. Each of the plurality of first fin type active areas FA1 may include a channel area CH that faces each of the plurality of gates 160.

On the substrate 110, a device isolation layer 112 is formed. The device isolation layer 112 may cover lower side walls at both sides of each of the plurality of fin type active areas FA. Each of the plurality of gates 160 may be arranged on the device isolation layer 112 between adjacent two first fin type active areas FA1 among the plurality of first fin type active areas FA1. In some example embodiments, the device isolation layer 112 may be formed of a silicon oxide layer. In some example embodiments, the device isolation layer 112 may include an insulating liner (not shown) that covers the lower side walls of the plurality of first fin type active areas FA1 and a gap-fill insulating layer (not shown) that covers the insulating liner. The insulating liner may be formed of a silicon nitride layer, a silicon oxynitride layer, polysilicon, or a combination thereof. The gap-fill insulating layer may be formed of a silicon oxide layer.

A space between each of the plurality of first fin type active areas FA1 and each of the plurality of gates 160 may be filled with a gate insulating layer 120. The gate insulating layers 120 may fill a first space S1 between one of a pair of first fin type active areas FA1 arranged at both sides of one of the plurality of gates 160 in the X direction and the gate 160, and a second space S2 between the other of the pair of first fin type active areas FA1 and the gate 160. In some example embodiments, in the gate insulating layer 120, a thickness of a part that fills the first space S1 in the X direction may be equal to that of a part that fills the second space S2 in the X direction. In some example embodiments, in the gate insulating layer 120, a thickness of a part that fills the first space S1 in the X direction may be different from that of a part that fills the second space S2 in the X direction.

The gate insulating layer 120 may include a first gate insulating layer 122 that covers side walls and an upper surface of each of the plurality of first fin type active areas FA1, a second gate insulating layer 128 that covers side walls and a lower surface of each of the plurality of gates 160, and a gap-fill gate insulating layer 124 that fills the first space S1 and the second space S2 between the first gate insulating layer 122 and the second gate insulating layer 128. The gap-fill gate insulating layer 124 may include parts interposed between the plurality of first fin type active areas FA1 and the plurality of gates 160 in the first space S1 and the second space S2. The gap-fill gate insulating layer 124 may cover the side walls and upper surface of each of the plurality of first fin type active areas FA1 with the first gate insulating layer 122 interposed.

The first gate insulating layer 122 may be formed of a silicon oxide layer. The second gate insulating layer 128 may be formed of a high-k dielectric layer having a dielectric constant greater than that of a silicon oxide layer. The high dielectric layer may be formed of a metal oxide or a metal oxynitride. For example, the high dielectric layer may be formed of a hafnium oxide layer. However, the inventive concepts are not limited thereto. The gap-fill gate insulating layer 124 may be formed of a silicon oxide layer.

A pair of second fin type active areas FA2 may be arranged at both sides of the gate 160 in the Y direction and the gate 160 and the pair of second fin type active areas FA2 may be aligned on a straight line in the Y direction.

In the gate peripheral area GPA, the pair of source/drain areas 170 may be arranged on the plurality of fin type active areas FA. The pair of source/drain areas 170 may be arranged at both sides of the plurality of gates 160 in the Y direction, and may be may be provided on the plurality of first fin type active areas FA1 and the plurality of second fin type active areas FA2 and connected to the plurality of first fin type active areas FA1 and the plurality of second fin type active areas FA2. Under one source/drain area 170, in the X direction, the plurality of first fin type active areas FA1 and the plurality of second fin type active areas FA2 may be alternately arranged one by one.

Between the plurality of gates 160 and the pair of source/drain area 170, a plurality of insulating spacer patterns 140C may be arranged. The plurality of insulating spacer patterns 140C may be apart from the plurality of gates 160 with the second gate insulating layer 128 interposed. The plurality of insulating spacer patterns 140C may be formed of a silicon nitride layer.

The plurality of gates 160 and the gate insulating layer 120 may be covered with an insulating layer 174. The insulating layer 174 may be formed of an oxide layer, a nitride layer, or a combination thereof. A plurality of gate contacts 182 may be connected to the plurality of gates 160 through the insulating layer 174. On the plurality of gate contacts 182 and the insulating layer 174, a metal wiring layer 184 may be formed. In some example embodiments, the plurality of gate contacts 182 may include W and the metal wiring layer 184 may include copper (Cu). However, the inventive concepts are not limited thereto. The plurality of gates 160 are connected to the metal wiring layer 184 through the plurality of gate contacts 182 and may form a gate structure GS1. The gate structure GS1 and the pair of source/drain areas 170 arranged at both sides of the gate structure GS1 in the Y direction may form the transistor TR1.

The integrated circuit device 100 described with reference to FIGS. 1A to 1C includes the plurality of gates 160 interposed one by one among the plurality of first fin type active areas FA1 and the plurality of gates 160 longitudinally extend to run parallel with the plurality of first fin type active areas FA1 in the Y direction. In each of the plurality of first fin type active areas FA1, a channel CH may be formed in a portion that faces each of the plurality of gates 160. In the integrated circuit device 100, the first space S1 and the second space S2 between the plurality of first fin type active areas FA1 and the plurality of gates 160 may be filled with the gate insulating layer 120 and, by controlling sizes of the first space S1 and the second space S2, a thickness of the gate insulating layer 120 may be controlled as desired. Therefore, in accordance with a magnitude of an operating voltage of the transistor TR1, the thickness of the gate insulating layer 120 may be easily controlled by controlling the sizes of the first space S1 and the second space S2.

For example, in a case in which a transistor in a conventional fin field-effect transistor (FinFET) structure using a fin type active area is used as a high voltage transistor having an operating voltage of no less than about 5 V, when the thickness of the gate insulating layer is increased so as to be suitable for drive at a desired operating voltage, a thickness of a gate formed on the gate insulating layer may be reduced in proportion to the increased thickness of the gate insulating layer. Thus, on a top portion of a fin type active area used as a channel area, a thickness of a gate may be excessively reduced or the gate may be cut off so that a gate insulating layer may be exposed, Accordingly, an effective area of the fin type active area that can be used as an active area may be reduced.

However, according to some example embodiments of the inventive concepts, unlike in a conventional transistor having an FinFET structure, when the thickness of the gate insulating layer 120 is increased so as to be suitable for drive at a desired operating voltage, it is possible to mitigate or prevent the thickness of the gate 160 from being excessively reduced or to prevent the gate 160 from being cut off, and therefore it is possible to prevent a characteristic of a transistor from deteriorating due to increase in thickness of the gate insulating layer 120. Therefore, the integrated circuit device 100 according to some example embodiments of the inventive concepts may provide a structure more suitable for implementing a high voltage transistor having an operating voltage of no less than about 5 V.

Figure 2:
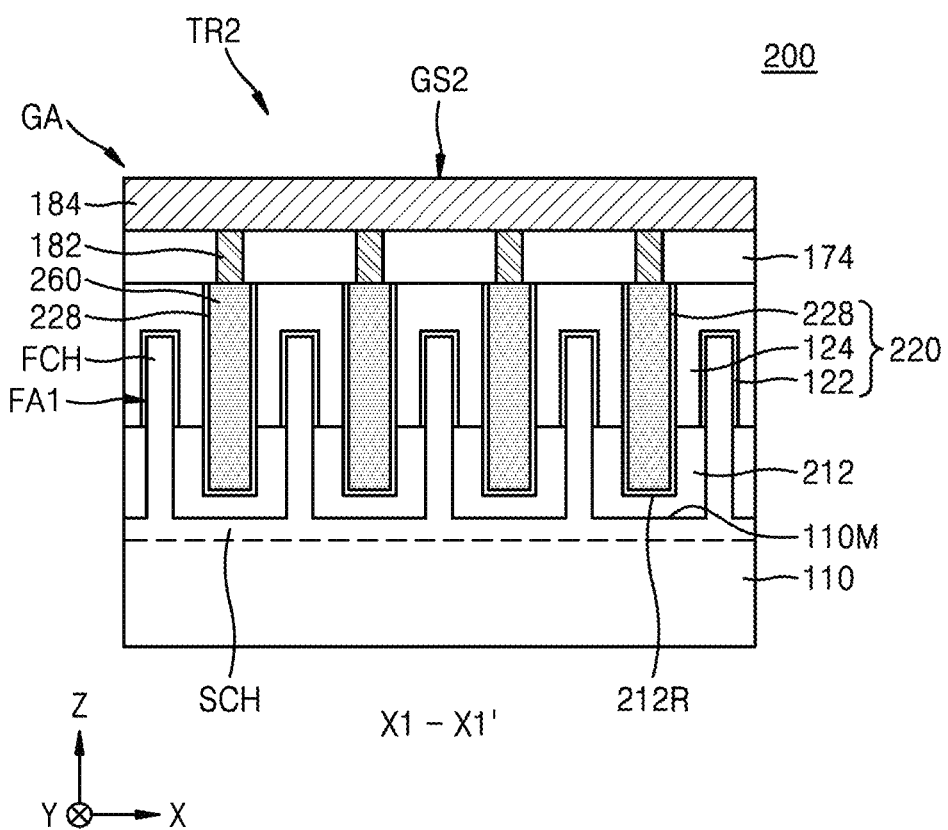
FIG. 2 is a cross-sectional view illustrating an integrated circuit device according to an example embodiment of the inventive concepts.

FIG. 2 is a cross-sectional view illustrating an integrated circuit device 200 according to an example embodiment of the inventive concepts. In FIG. 2, some components in a portion taken along the line X1-X1' of FIG. 1A is illustrated.

Referring to FIG. 2, the integrated circuit device 200 has the same or substantially similar configuration as that of the integrated circuit device 100 described with reference to FIGS. 1A to 1C. The integrated circuit device 200 includes an insulating layer 212 arranged among the plurality of first fin type active areas FA1 to cover lower side walls of the plurality of first fin type active areas FA1, a plurality of gates 260 arranged on the insulating layer 212 among the plurality of first fin type active areas FA1, and a gate insulating layer 220 that fills spaces between the plurality of first fin type active areas FA1 and the plurality of gates 260. The plurality of gates 260 may be connected to the metal wiring layer 184 through the plurality of gate contacts 182 and may form a gate structure GS2. The gate structure GS2 may form a transistor TR2 together with a pair of source/drain areas having the same configuration as that of the pair of source/drain areas 170 (refer to FIG. 1A).

A configuration of the insulating layer 212 is the same as or substantially similar to that of the device isolation layer 112 described with reference to FIGS. 1B and 1C except that each of a plurality of recesses 212R is formed on an upper surface of the insulating layer 212, in positions that face the plurality of gates 260. A part of each of the plurality of gates 260 is accommodated in a corresponding one of the plurality of recesses 212R.

The gate insulating layer 220 may include a first gate insulating layer 122, a second gate insulating layer 228, and a gap-fill gate insulating layer 124 including parts interposed between the first gate insulating layer 122 and the second gate insulating layer 228. The second gate insulating layer 228 may cover side walls and a lower surface of each of the plurality of gates 260.

Detailed configuration of the plurality of gates 260 and the second gate insulating layer 228 is the same as or substantially similar to that of the plurality of gates 160 and the second gate insulating layer 128 described with reference to FIGS. 1A to 1C.

In the integrated circuit device 200 described with reference to FIG. 2, as parts of the plurality of gates 260 are accommodated in the plurality of recesses 212R and extend from the upper surface of the insulating layer 212 toward the substrate 110, a length of each of the plurality of gates 260 in the vertical direction may be greater than that of each of the plurality of gates 160 of FIGS. 1A to 1C. Therefore, in the plurality of gates 260, areas of portions that face the plurality of first fin type active areas FA1 may increase. Therefore, because a length of each of channel areas FCH included in the plurality of first fin type active areas FA1 in the vertical direction increases and a channel width of the transistor TR2 increases, performance of the transistor TR2 may improve.

In some example embodiments, in the insulating layer 212, portions interposed between the plurality of gates 260 and the plurality of first fin type active areas FA1 may be used as a gate insulating layer. In some example embodiments, other than the channel areas FCH included in plurality of first fin type active areas FA1, the integrated circuit device 200 may further include channel areas SCH provided in the substrate 110 in portions that face the plurality of gates 260. In this case, in the insulating layer 212, portions that surround lower portions of the plurality of gates 260 may be used as a gate insulating layer.

Figure 3:
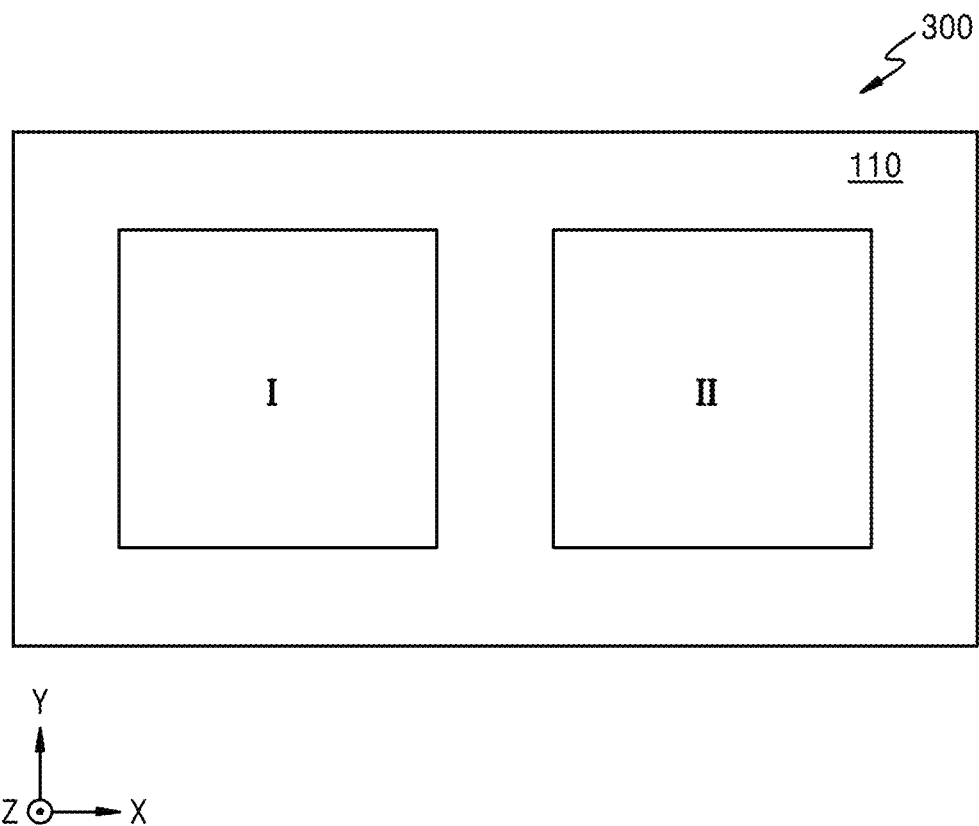
FIG. 3 is a block diagram of an integrated circuit device according to an example embodiment of the inventive concepts.

FIG. 3 is a block diagram of an integrated circuit device 300 according to an example embodiment of the inventive concepts.

Referring to FIG. 3, the integrated circuit device 300 includes a substrate 110 having a first area I and a second area II. A detailed configuration of the substrate 110 is the same as described with reference to FIGS. 1A to 1C.

The first area I and the second area II may perform different functions on the substrate 110. The first area I and the second area II may be apart from or connected to each other.

In some example embodiments, the first area I may be a high voltage transistor area to which a high operating voltage is applied and the second area II may be a low voltage transistor area to which a low operating voltage is applied In the present disclosure, a high voltage transistor may mean a transistor having an operating voltage of about no less than about 5 V and a low voltage transistor may mean a transistor having an operating voltage less than about 5 V.

In some example embodiments, the first area I may be a region in which a transistor having a high threshold voltage and high reliability is formed even though a switching speed is not high. In some example embodiments, the first area I may be a peripheral circuit area in which peripheral circuits for inputting external data to an internal circuit of the integrated circuit device 200 or outputting data from the internal circuit of the integrated circuit device 200 to the outside are formed. In some example embodiments, the first area I may form a part of an input and output I/O circuit device.

In some example embodiments, the second area II may be a region in which a transistor having a low threshold voltage and a high switching speed is formed. In some example embodiments, the second area II may be a cell array area in which unit memory cells are arranged in a matrix. In some example embodiments, the second area II may be a logic cell area or a memory cell area. The logic cell area may include various kinds of logic cells including a plurality of circuit elements such as a transistor and a register as standard cells for performing a desired logical function such as a counter and a buffer. The logic cells may form, for example, AND, NAND, OR, NOR, exclusive OR (XOR), exclusive NOR (XNOR), an inverter INV, an adder ADD, a buffer BUF, delay DLY, a filter FILL, a multiplexer MXT/MXIT, OAI (OR/AND/INVERTER), AO(AND/OR), AOI(AND/OR/INVERTER), a D flip-flop, a reset flip-flop, a master-slaver flip-flop, and a latch. However, the logic cells are only an example and the inventive concepts are not limited thereto. The memory cell area may be at least one of static random access memory (SRAM), dynamic RAM (DRAM), magnetic RAM (MRAM), resistive RAM (RRAM), and phase-change RAM (PRAM).

The first area I may include at least one of the transistor TR1 included in the integrated circuit device 100 described with reference to FIGS. 1A to 1C or the transistor TR2 included in the integrated circuit device 200 described with reference to FIG. 2. In the second area II, transistors in the FinFET structure may be formed.

Figure 4A:
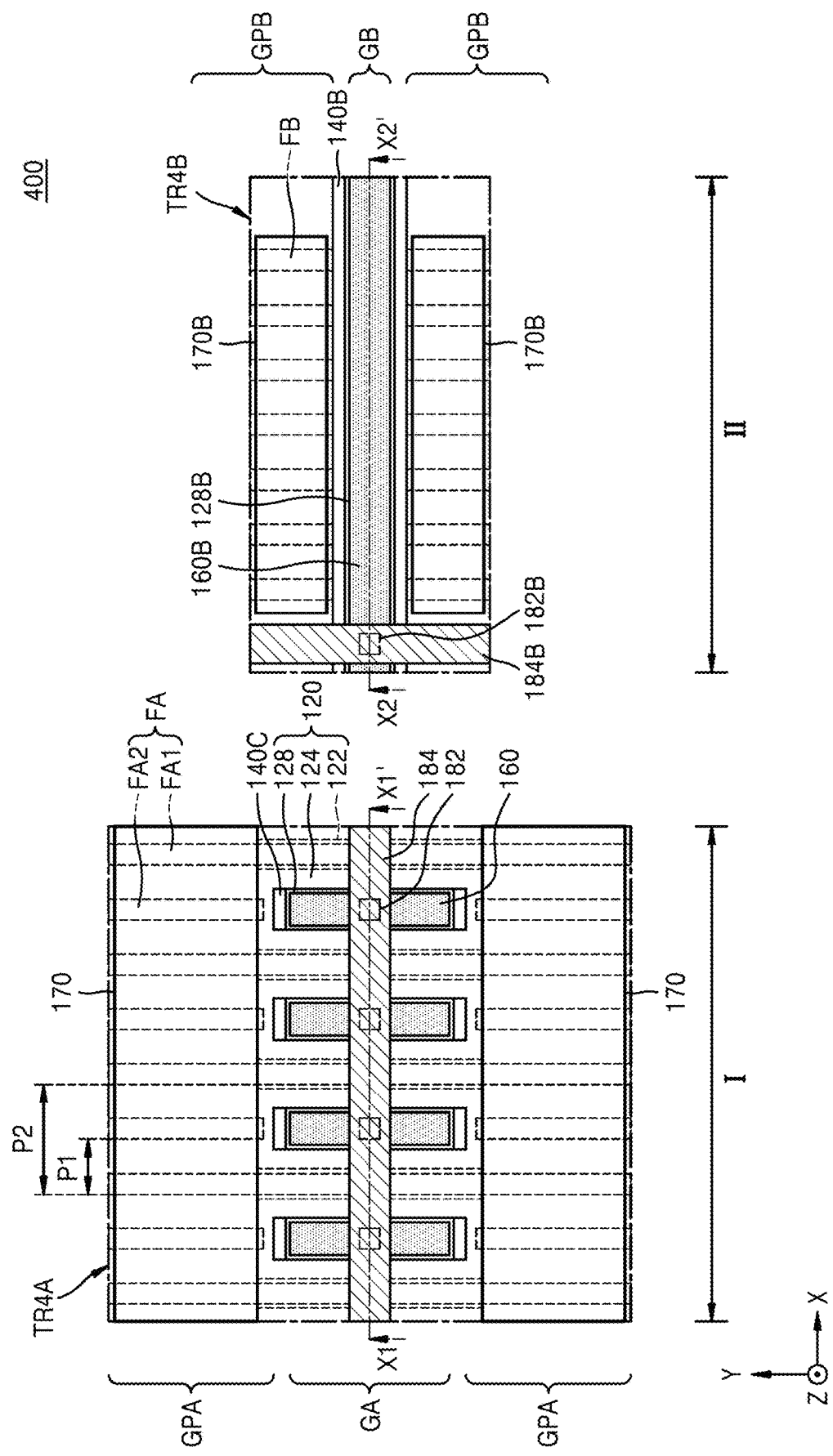
FIG. 4A is a plan view illustrating some areas of an integrated circuit device according to an example embodiment of the inventive concepts.
Figure 4B:
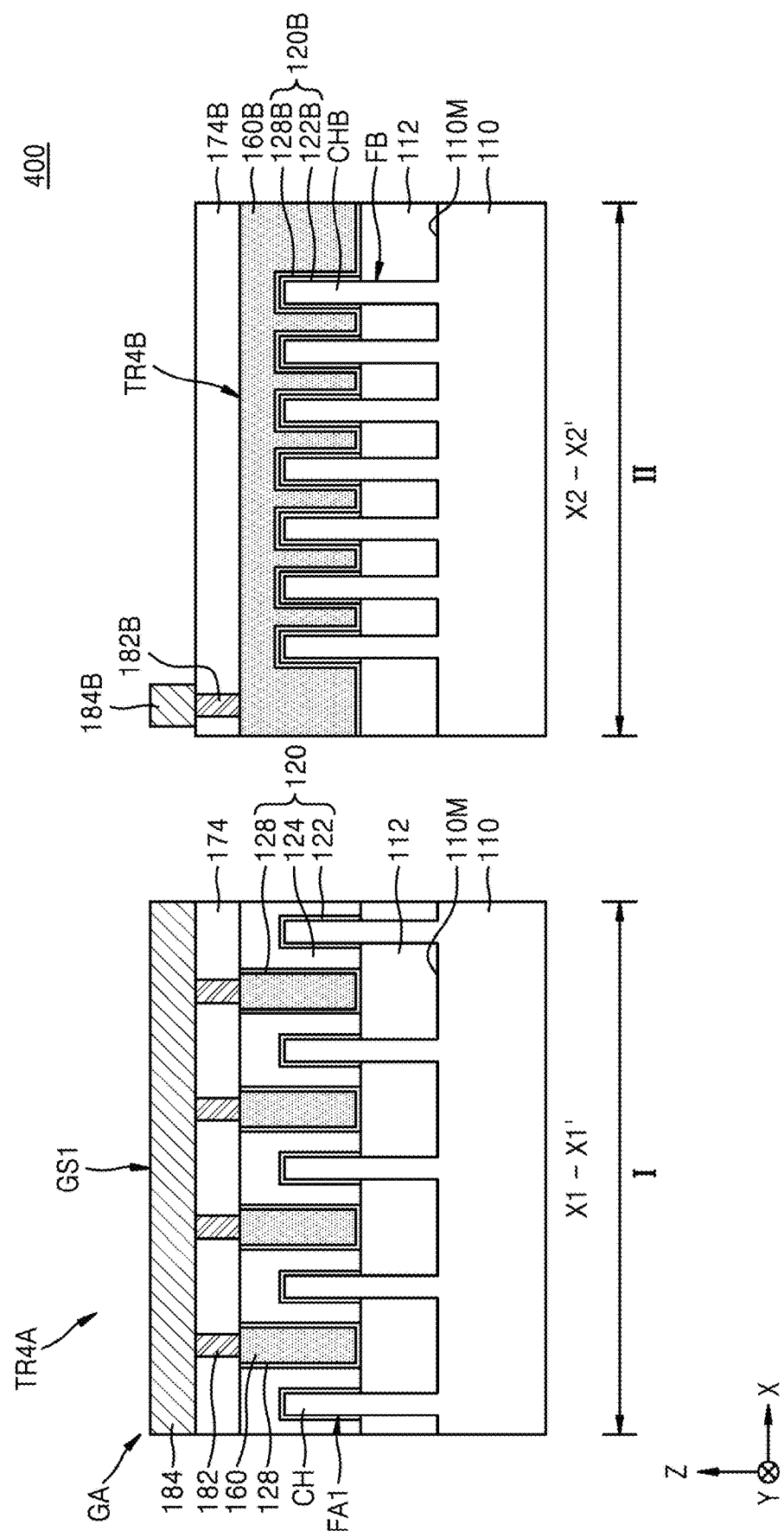
FIG. 4B is a cross-sectional view illustrating some components taken along lines X1-X1' and X2-X2' of FIG. 4A.

FIGS. 4A to 4C are views illustrating an integrated circuit device 400 according to an example embodiment of the inventive concepts. FIG. 4A is a plan view illustrating some areas of the integrated circuit device 400. FIG. 4B is a cross-sectional view illustrating some components taken along the lines X1-X1' and X2-X2' of FIG. 4A. FIG. 4C is a plan view illustrating a plurality of fin type active areas FA in the first area I and a plurality of third fin type active areas FB in the second area II in the integrated circuit device 400. In FIGS. 4A to 4C, the same reference numerals as those of FIGS. 1A to 1C and 3 denote the same members, and thus the description of which is omitted.

Referring to FIGS. 4A to 4C, the integrated circuit device 400 includes a substrate 110 having a first area I and a second area II, a first transistor TR4A formed in the first area I, and at least one second transistor TR4B formed in the second area II.

The first transistor TR4A may have the same configuration as that of the transistor TR1 described with reference to FIGS. 1A to 1C.

The at least one second transistor TR4B formed in the second area II may have the FinFET structure. In the second area II, a plurality of third fin type active areas FB protrude from the main surface 110M of the substrate 110 in the vertical direction (the Z direction) that is the normal direction with respect to the main surface 110M. Lower side walls of each of the plurality of third fin type active areas FB are surrounded with the device isolation layer 112. Upper portions of the plurality of third fin type active areas FB protrude upward the device isolation layer 112. The plurality of third fin type active areas FB include channel areas CHB in the upper portions thereof. The plurality of third fin type active areas FB may be formed of the same material as the substrate 110. The plurality of third fin type active areas FB may extend to run parallel with each other in the Y direction.

Upper side walls and an upper surface of each of the plurality of third fin type active areas FB may be covered with a first gate insulating layer 122B. The first gate insulating layer 122B may be formed of a silicon oxide layer. On the plurality of third fin type active areas FB, a second gate insulating layer 128B and a gate line 160B may longitudinally extend in the X direction that intersects the plurality of third fin type active areas FB. Side walls of the gate line 160B may be covered with an insulating spacer 140B. The gate line 160B may be apart from the insulating spacer 140B with the second gate insulating layer 128B interposed.

A material of the second gate insulating layer 128B is the same as that of the second gate insulating layer 128 described with reference to FIGS. 1A to 1C. A material of the gate line 160B is the same as that of the plurality of gates 160 described with reference to FIGS. 1A to 1C. The insulating spacer 140B may be formed of a silicon nitride layer. The first gate insulating layer 122B and the second gate insulating layer 128B may form a second area gate insulating layer 120B. A thickness of the gate insulating layer 120 in the X direction may be greater than that of the second area gate insulating layer 120B in the X direction.

At both sides of the gate line 160B in the Y direction, a pair of source/drain areas 170B may be formed. The pair of source/drain areas 170B may be formed on the plurality of third fin type active areas FB. In FIG. 4A, in the second area II, one source/drain area 170B is illustrated as being connected to the plurality of third fin type active areas FB. However, the inventive concepts are not limited thereto. For example, an individual source/drain area may be formed on each of the plurality of third fin type active areas FB, or a source/drain area may be formed to be connected to at least two third fin type active areas FB.

At a point at which each of the plurality of third fin type active areas FB intersects the gate line 160B, the second transistor TR4B may be formed. The second transistor TR4B may form a three-dimensional metal oxide semiconductor (MOS) transistor in which a channel is formed on upper surfaces of the plurality of third fin type active areas FB and at both side walls of the plurality of third fin type active areas FB.

The gate line 160B may be covered with an insulating layer 174B. The insulating layer 174B may be formed of an oxide layer, a nitride layer, or a combination thereof. A gate line contact 182B may be connected to the gate line 160B through the insulating layer 174B. On the gate line contact 182B and the insulating layer 174B, a metal wiring layer 184B may be formed. Detailed configuration of a material of the gate line contact 182B and the metal wiring layer 184B is the same as or substantially similar to that of the gate contact 182 and the metal wiring layer 184 described with reference to FIGS. 1A to 1C.

As illustrated in FIG. 4C, in the gate peripheral area GPA of the first area I, the plurality of fin type active areas FA including the plurality of first fin type active areas FA1 and the plurality of second fin type active areas FA2 may be repeatedly arranged in the X direction with the first pitch P1. In the gate area GA of the first area I, the plurality of first fin type active areas FA1 may be repeatedly arranged with the second pitch P2, which is twice the first pitch P1. In the second area II, the plurality of third fin type active areas FB may be repeatedly arranged in the X direction with the first pitch P1. In the first and second areas I and II, a width of each of the plurality of fin type active areas FA in the X direction and a width of each of the plurality of third fin type active areas FB in the X direction may be the same, that is, a first width W1.

In the integrated circuit device 400 described with reference to FIGS. 4A to 4C, in the first area I, the plurality of gates 160 are connected to the metal wiring layer 184 and may form the gate structure GS1. In the first area I, in the first transistor TR4A including the gate structure GS1 and the pair of source/drain areas 170 arranged at both sides of the gate structure GS1, portions of the plurality of first fin type active areas FA1 that longitudinally extend between the pair of source/drain areas 170 in the Y direction and face the plurality of gates 160 may be used as a channel area. The first transistor TR4A may be used as a high voltage transistor to which a high operating voltage of no less than about 5 V is applied. In the second area II, along the gate line 160B that extends in the X direction across the plurality of third fin type active areas FB, the at least one second transistor TR4B may be formed. In the second transistor TR4B, both side walls and an upper surface of each of the plurality of third fin type active areas FB may be used as a channel area. The second transistor TR4B may be used as a low voltage transistor to which a low operating voltage of less than about 5 V is applied.

Figure 5A:
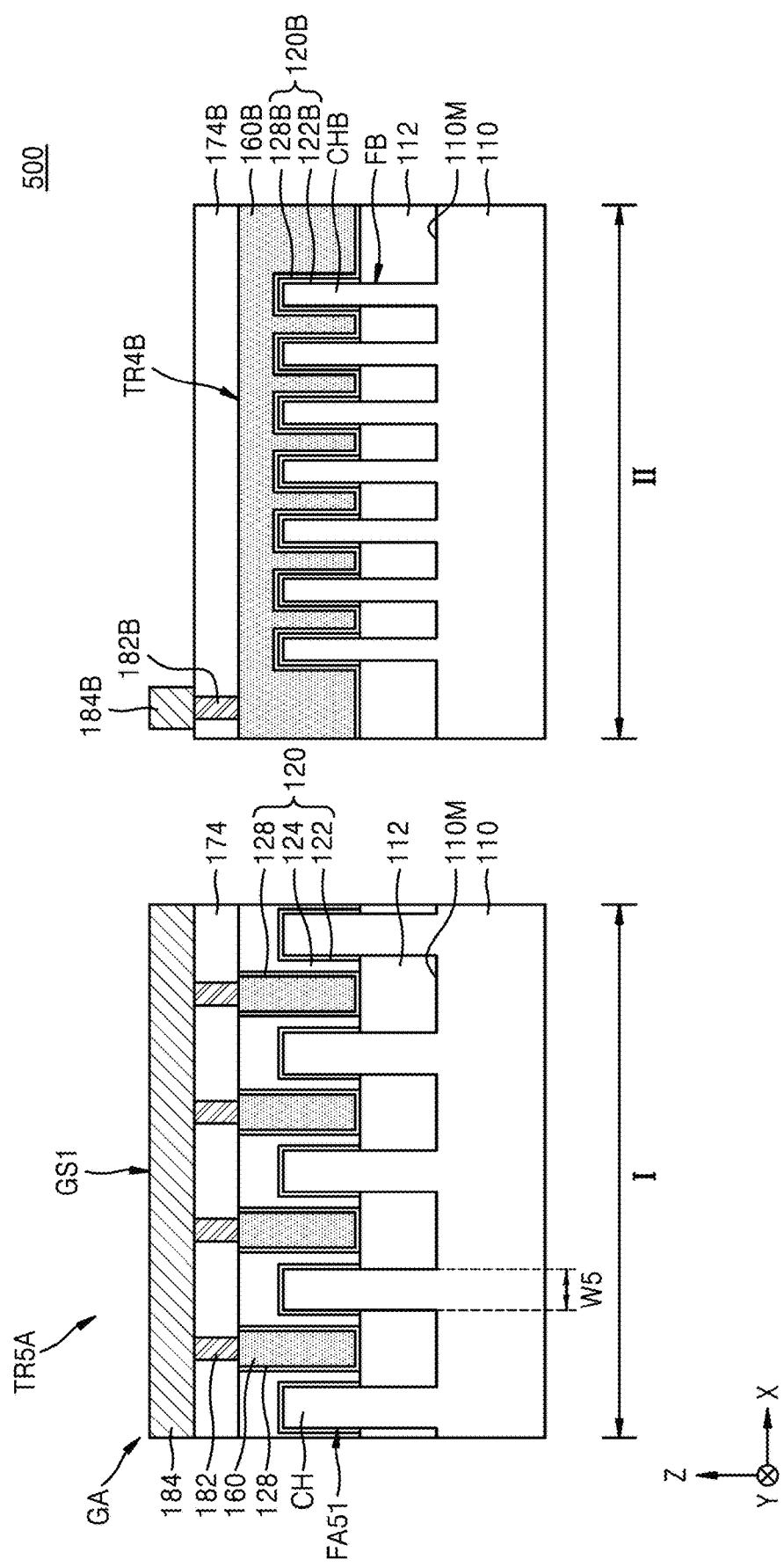
FIG. 5A is a cross-sectional view illustrating an integrated circuit device according to an example embodiment of the inventive concepts.
Figure 5B:
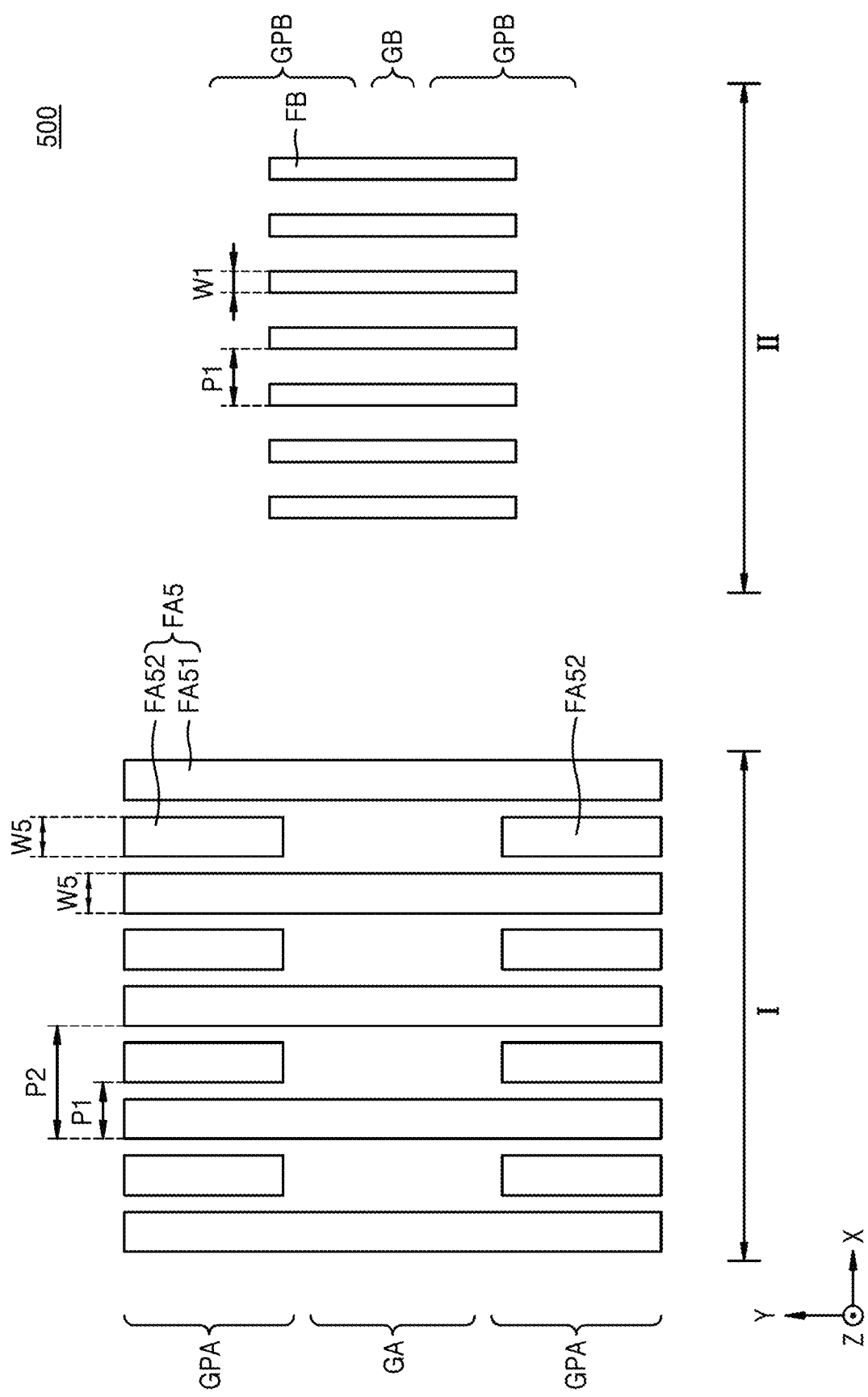
FIG. 5B is a plan view illustrating a plurality of fin type active areas in a first area and a plurality of third fin type active areas in a second area of the integrated circuit device of FIG. 5A.

FIGS. 5A and 5B are views illustrating an integrated circuit device 500 according to an example embodiment of the inventive concepts. FIG. 5A is a cross-sectional view illustrating portions corresponding to portions taken along the lines X1-X1' and X2-X2' of FIG. 4A, and FIG. 5B is a plan view illustrating a plurality of fin type active areas FA5 in the first area I and a plurality of third fin type active areas FB in the second area II of the integrated circuit device 500. In FIGS. 5A and 5B, the same reference numerals as those of FIGS. 1A to 4C denote the same members, and thus the description of which is omitted.

Referring to FIGS. 5A and 5B, the integrated circuit device 500 has the same or substantially similar configuration as that of the integrated circuit device 400 described with reference to FIGS. 4A to 4C. The integrated circuit device 500 includes a first transistor TR5A formed in the first area I and at least one second transistor TR5B formed in the second area II. The first transistor TR5A of the integrated circuit device 500 may have the same or substantially similar configuration as that of the first transistor TR4A of the integrated circuit device 400 described with reference to FIGS. 4A to 4C. The integrated circuit device 500 includes a plurality of fin type active areas FA5 arranged in the first area I. The plurality of fin type active areas FA5 may include a plurality of first fin type active areas FA51 and a plurality of second fin type active areas FA52. The plurality of fin type active areas FA5 may have the same or substantially similar configuration as that of the plurality of fin type active areas FA described with reference to FIGS. 1A to 1C. A width W5 of each of the plurality of first fin type active areas FA51 and the plurality of second fin type active areas FA52 in the X direction may be greater than the first width W1 of each of the plurality of third fin type active areas FB in the second area II in the X direction. In exemplary embodiments, the width W5 of each of the plurality of fin type active areas FA5 in the X direction may be about 1.5 to 2 times the first width W1. However, the inventive concepts are not limited thereto.

In the gate area GA of the first area I, the plurality of first fin type active areas FA1 may be repeatedly arranged with the second pitch P2, which is twice the first pitch P1. Because the plurality of fin type active areas FA5 in the gate peripheral area GPA of the first area I and the plurality of third fin type active areas FB in the second area II are arranged with the first pitch P1 in the X direction and the width W5 of each of the plurality of fin type active areas FA5 in the X direction is greater than the first width W1 of each of the plurality of third fin type active areas FB, intervals at which the plurality of fin type active areas FA5 are apart from each other in the gate peripheral area GPA of the first area I may be less than intervals at which the plurality of fin type active areas FA are apart from each other in the second area II. In the first area I, by controlling the width of each of the plurality of fin type active areas FA5 in the X direction to be different from that of each of the plurality of gates 160 in the X direction, the thickness of the gate insulating layer 120 interposed between the plurality of fin type active areas FA5 and the plurality of gates 160 may vary.

A detailed configuration of the second transistor TR4B formed in the second area II is the same as described with reference to FIGS. 4A to 4C.

Figure 6A:
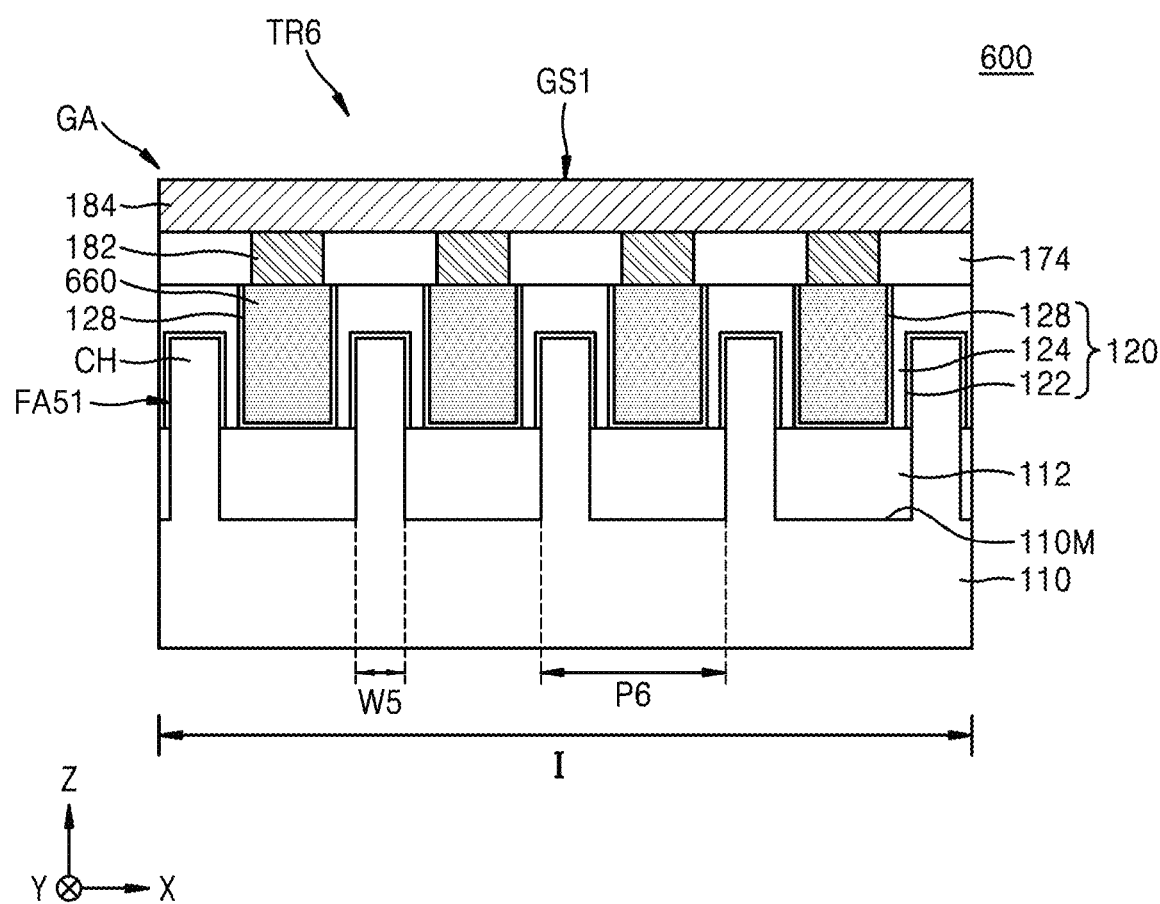
FIGS. 6A and 6B are cross-sectional views illustrating an integrated circuit device according to an example embodiment of the inventive concepts.
Figure 6B:
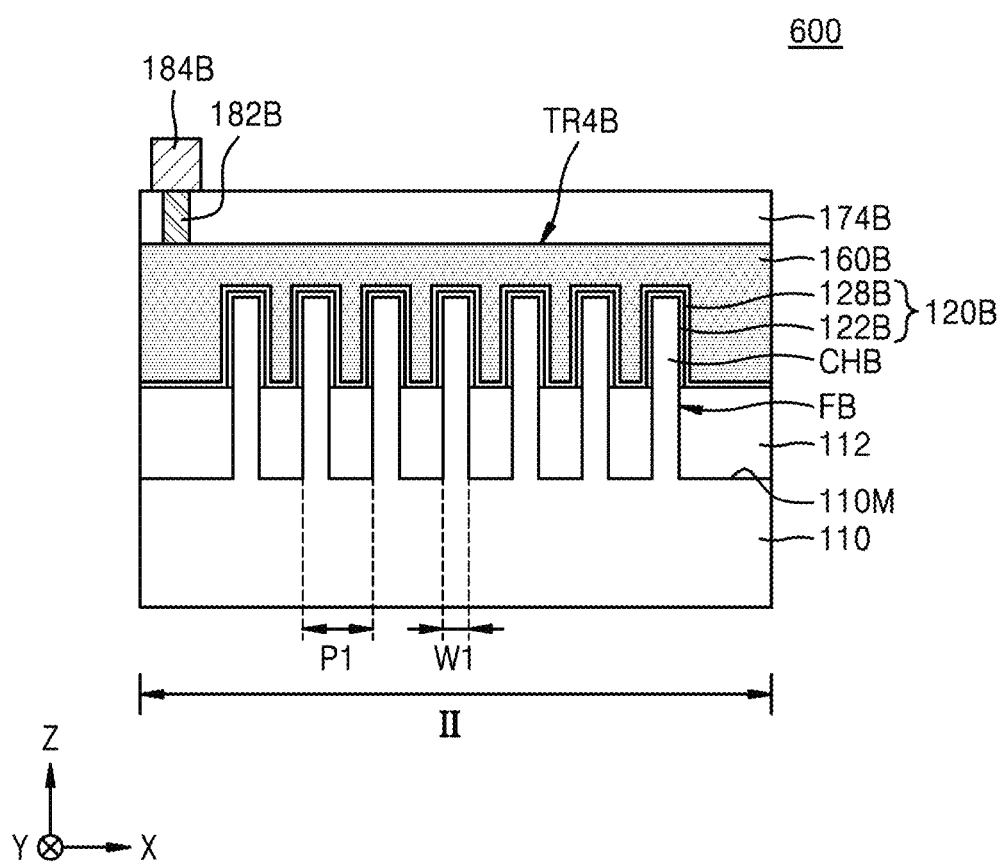

FIGS. 6A and 6B are cross-sectional views illustrating an integrated circuit device 600 according to an example embodiment of the inventive concepts. FIG. 6A is a cross-sectional view of a portion taken along the line X1-X1' of FIG. 4A and FIG. 6B is a cross-sectional view of portions taken along the line X2-X2' of FIG. 4A. In FIGS. 6A and 6B, the same reference numerals as those of FIGS. 1A to 5B denote the same members, and thus the description of which is omitted.

Referring to FIGS. 6A and 6B, the integrated circuit device 600 may have the same or substantially similar configuration as that of the integrated circuit device 500 described with reference to FIGS. 5A and 5B. The integrated circuit device 600 includes a first transistor TR6 formed in a first area I and at least one second transistor TR4B formed in a second area II. The first transistor TR6 of the integrated circuit device 600 may have the same or substantially similar configuration as that of the first transistor TR5A described with reference to FIGS. 5A and 5B. The plurality of first fin type active areas FA51 in the gate area GA of the first area I may be repeatedly arranged with a pitch P6 greater than the first pitch P1 in the X direction. The width W5 and the pitch P6 of the plurality of first fin type active areas FA51 in the gate area GA of the first area I may be greater than the first width W1 and the first pitch P1 of the plurality of third fin type active areas FB in the second area II. A plurality of gates 660 may be arranged on the device isolation layer 112 between two adjacent first fin type active areas FA51 of the plurality of first fin type active areas FA51. A detailed configuration of the plurality of gates 660 is the same as or substantially similar to that of the plurality of gates 160 described with reference to FIGS. 1A to 1C.

In the integrated circuit device 600, the width W5 and the pitch P6 of the plurality of first fin type active areas FA51 and the width of each of the plurality of gates 160 in the X direction may vary in accordance with a magnitude of an operating voltage of the first transistor TR6. In the integrated circuit device 600, by properly selecting the width W5 and the pitch P6 of the plurality of first fin type active areas FA51 and the width of each of the plurality of gates 160 in the X direction, the first transistor TR6 to which a high operating voltage of no less than about 5 V may be easily implemented in the first area I.

Figure 7:
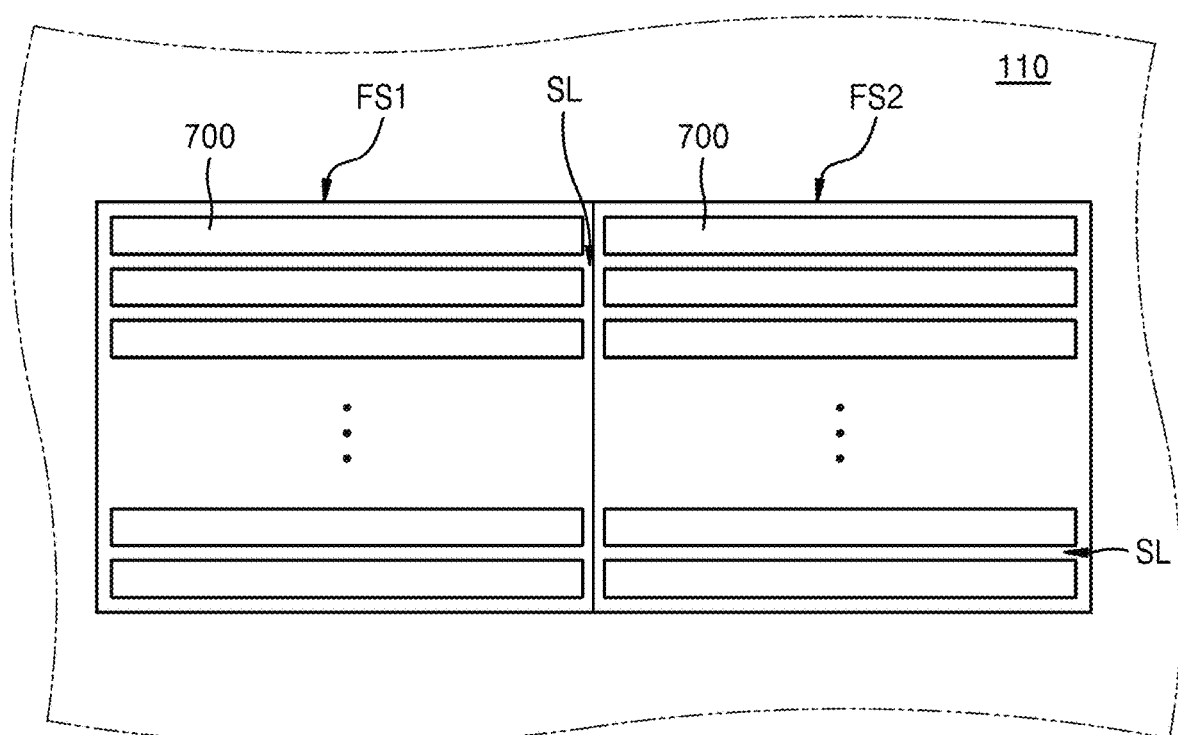
FIG. 7 is a schematic plan view illustrating an integrated circuit chip according to an example embodiment of the inventive concepts.

FIG. 7 is a schematic plan view illustrating a plurality of integrated circuit chips 700 according to an example embodiment of the inventive concepts.

In FIG. 7, among the plurality of integrated circuit chips 700 formed on the substrate 110, a plurality of integrated circuit chips 700 included in two full-shots FS1 and FS2 are illustrated. The plurality of integrated circuit chips 700 before being divided and individualized through a sawing process are illustrated in FIG. 7. On the substrate 110, the plurality of integrated circuit chips 700 are apart from each other with a scribe lane SL interposed. In each of the full-shots FS1 and FS2, the plurality of integrated circuit chips 700 may be included. Each of the plurality of integrated circuit chips 700 may include at least one of integrated circuit devices 100, 200, 300, 400, 500, and 600 described with reference to FIGS. 1A to 6B.

Each of the plurality of integrated circuit chips 700 may be a memory chip or a non-memory chip. In some example embodiments, each of the plurality of integrated circuit chips 700 may form a display driver integrated circuit (DDI) chip.

Figure 8:
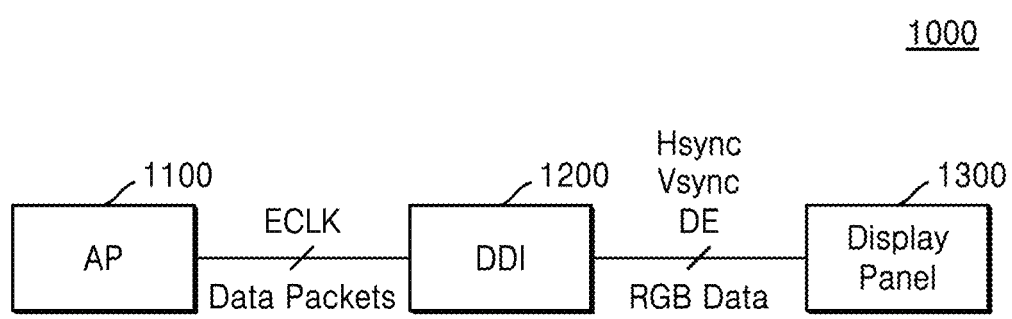
FIG. 8 is an example block diagram illustrating a display device according to an example embodiment the inventive concepts.

FIG. 8 is an example block diagram illustrating a display device 1000 according to an example embodiment of the inventive concepts.

Referring to FIG. 8, the display device 1000 includes an application processor (hereinafter, referred to as AP) 1100, a DDI chip 1200, and a display panel 1300.

The AP 1100 controls an overall operation of the display device 1000 and inputs and outputs data packets having display data in response to a clock ECLK. The data packets may include, for example, display data RGB Data, a horizontal synchronizing signal Hsync, a vertical synchronizing signal Vsync, and a data activating signal DE.

The data packets may be input from the AP 1100 to the DDI chip 1200, and the DDI chip 1200 may output the horizontal synchronizing signal Hsync, the vertical synchronizing signal Vsync, the data activating signal DE, and the display data RGB Data based on the data packets received from the AP 1100. In some example embodiments, the AP 1100 and the DDI chip 1200 may perform interfacing such as mobile industry processor interface (MIPI), mobile display digital interface (MDDI), and compact display port (CDP). In some example embodiments, for high speed serial interface with the AP 1100, graphic memory GRAM may be built in the DDI chip 1200. In some example embodiments, for high speed serial interface with the AP 1100, the DDI chip 1200 may buffer the data packets without using the graphic memory GRAM and may output the display data RGB Data.

In accordance with control of the DDI chip 1200, the display panel 1300 may display the display data RGB Data in units of frames. The display panel 1300 may be formed of an organic light emitting display (OLED) panel, a liquid crystal display (LCD) panel, a plasma display panel (PDP), an electrophoretic display panel, or an electro-wetting display panel. In some embodiments, the display panel 1300 may be connected to a touch screen (not shown) and may receive sensing data from the touch screen.

In the display device 1000 according to an example embodiment, the DDI chip 1200 may include at least one of the integrated circuit devices 100, 200, 300, 400, 500, and 600 described with reference to FIGS. 1A to 6B. Therefore, performance of high voltage transistors having a high operating voltage, which are included in the DDI chip 1200, may be increased.

FIGS. 9A to 17B are views illustrating a method of manufacturing an integrated circuit device in the process order according to an example embodiment of the inventive concepts, FIGS. 9A, 10A to 17A are plan views illustrating a method of manufacturing an integrated circuit device in the process order according to an example embodiments of the inventive concepts; FIGS. 9B, 10B to 17B are cross-sectional views illustrating some components taken along the lines X1-X1' and X2-X2' of FIGS. 9A, 10A to 17A according to an example embodiment of the inventive concepts. In FIGS. 9A to 17B, the same reference numerals as those of FIGS. 1 to 4C denote the same members, and thus the description of which is omitted.

Referring to FIGS. 9A and 9B, a substrate 110 including a first area I and a second area II is provided. A plurality of first mask patterns M1 are formed on the first area I of the substrate 110 and a plurality of second mask patterns M2 are formed on the second area II of the substrate 110. The plurality of first mask patterns M1 may be repeatedly arranged with the first pitch P1 in the X direction and may run parallel with each other in the Y direction in a gate peripheral area GPA of the first area I and may be repeatedly arranged with the second pitch P2, which is twice the first pitch P1 in the X direction and may run parallel with each other in the Y direction in a gate area GA of the first area I. The plurality of second mask patterns M2 may be repeatedly arranged with the first pitch P1 in the X direction and may run parallel with each other in the Y direction in a gate peripheral area GPB and a gate line area GB of the second area II.

The plurality of first and second mask patterns M1 and M2 may include a plurality of pad oxide patterns 712 and a plurality of hard mask patterns 714 sequentially formed on the substrate 110. The plurality of pad oxide patterns 712 may be formed of an oxide layer obtained by thermally oxidizing a surface of the substrate 110. The plurality of hard mask patterns 714 may be formed of a silicon nitride layer, a silicon oxynitride layer, a spin on glass (SOG) layer, a spin on hard mask (SOH) layer, or a combination thereof.

Figure 10A:
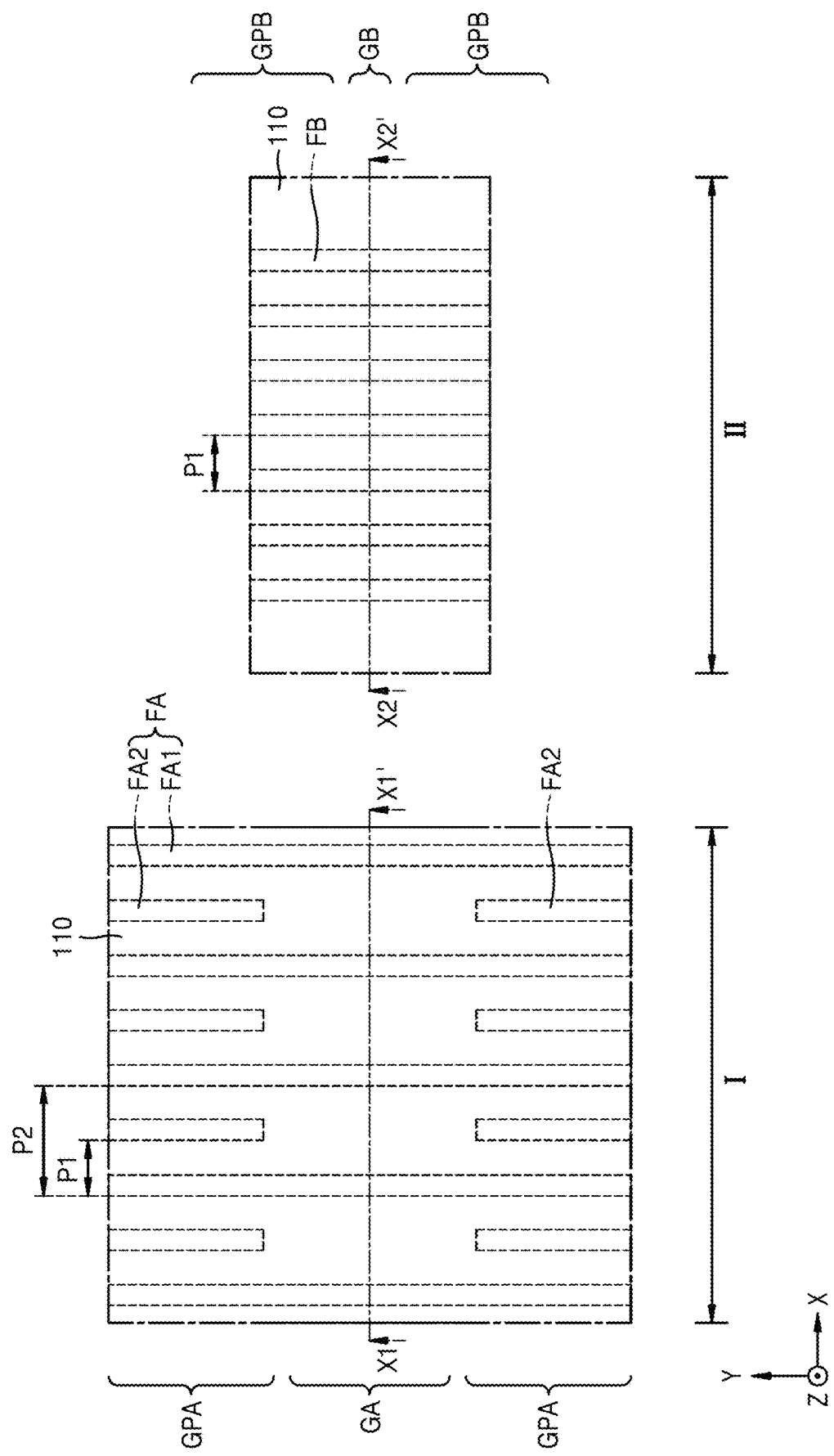
Figure 10B:
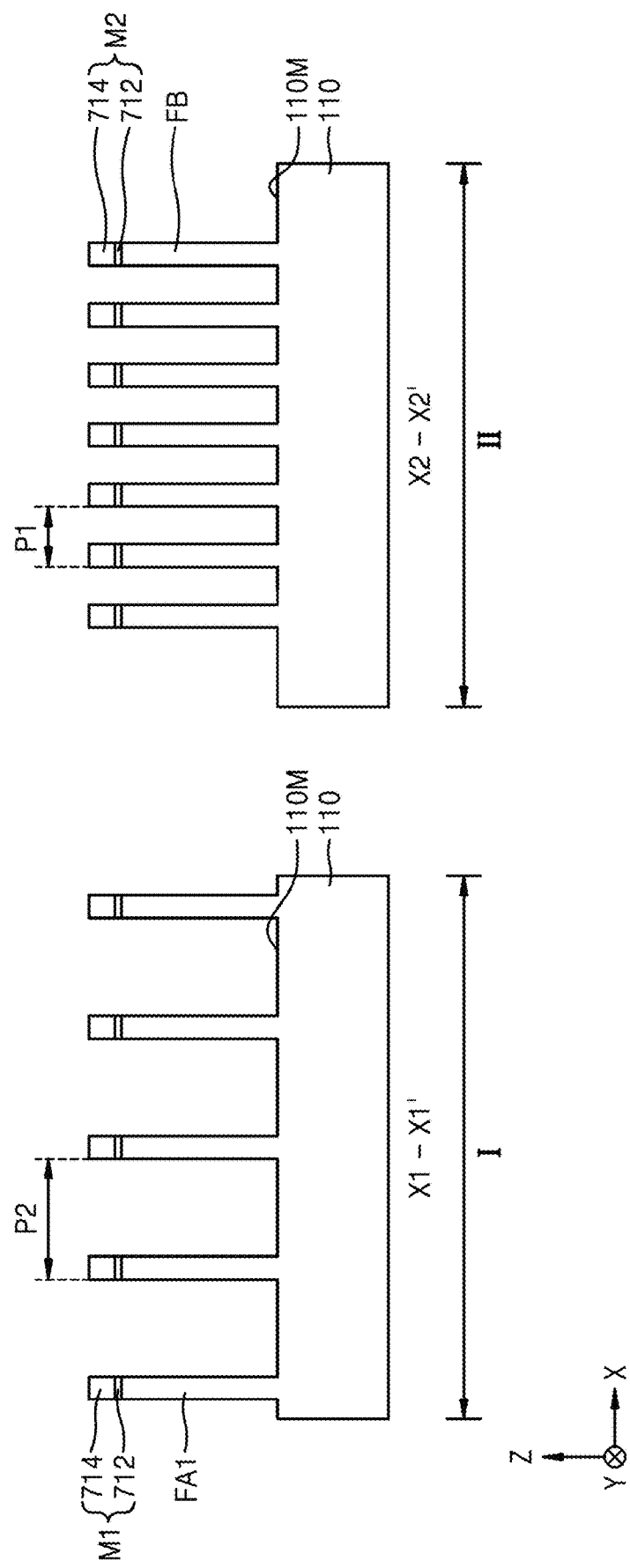

Referring to FIGS. 10A and 10B, by etching a partial area of the substrate 110 by using the plurality of first and second mask patterns M1 and M2 as an etching mask, a plurality of fin type active areas FA are formed in the first area I and a plurality of third fin type active areas FB are formed in the second area II. The plurality of fin type active areas FA and the plurality of third fin type active areas FB may protrude upward in a direction (a Z direction) perpendicular to a main surface 110M of the substrate 110 and may extend in the Y direction to run parallel with each other.

In the gate peripheral area GPA of the first area I, the plurality of fin type active areas FA may be repeatedly arranged with the first pitch P1 in the X direction and may run parallel with each other in the Y direction. In the gate area GA of the first area I, a plurality of first fin type active areas FA1 that are parts of the plurality of fin type active areas FA may be repeatedly arranged with the second pitch P2, which is twice the first pitch P1 in the X direction, and may run parallel with each other in the Y direction. In the gate peripheral area GPB and the gate line area GB of the second area II, the plurality of third fin type active areas FB may be repeatedly arranged with the first pitch P1 in the X direction, and may run parallel with each other in the Y direction.

The plurality of fin type active areas FA and the plurality of third fin type active areas FB may be covered with the plurality of first and second mask patterns M1 and M2. In FIG. 10A, for convenience sake, the plurality of first and second mask patterns M1 and M2 are not shown and the plurality of fin type active areas FA and the plurality of third fin type active areas FB are marked with dotted lines.

Figure 11A:
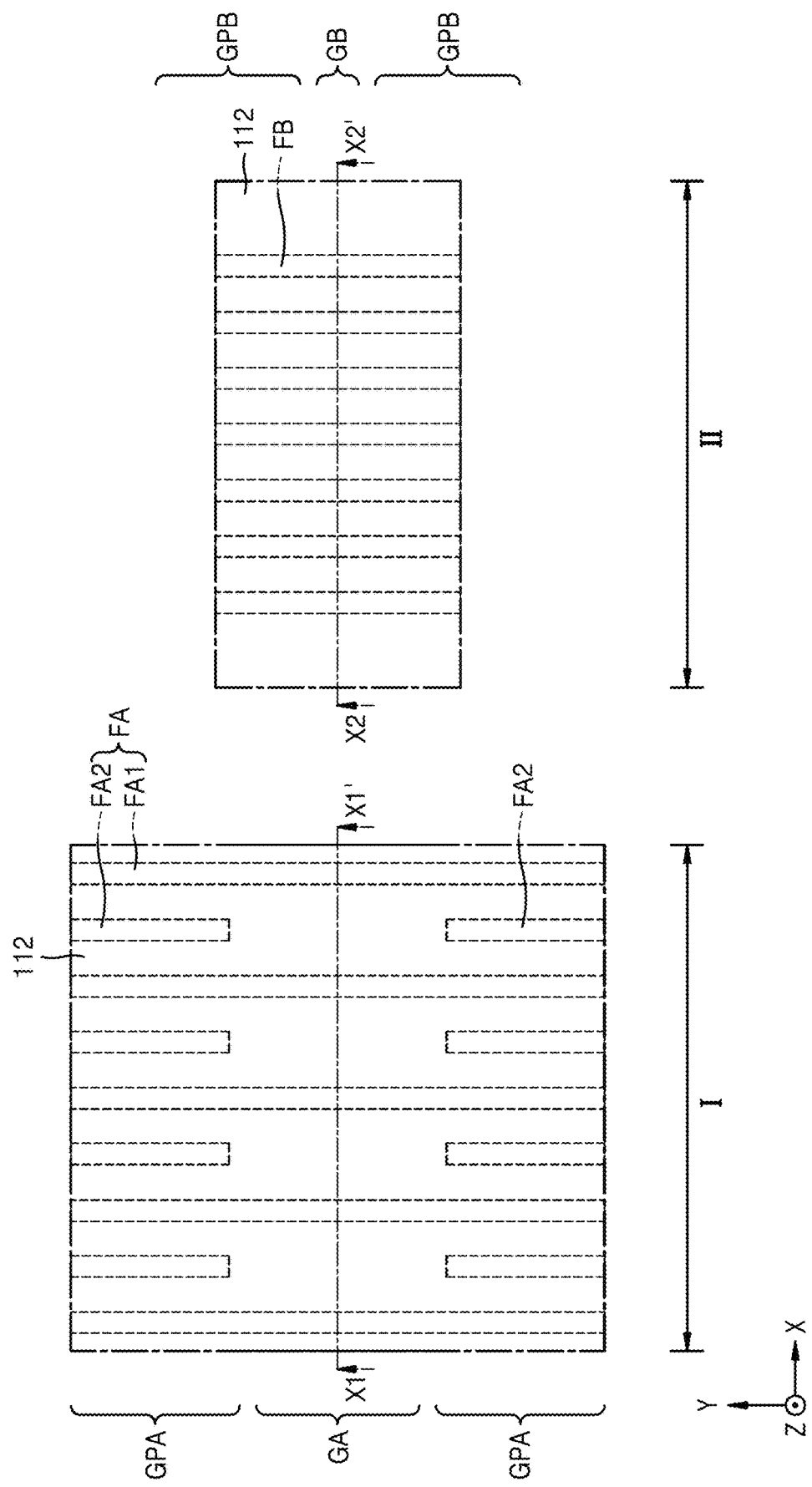
Figure 11B:
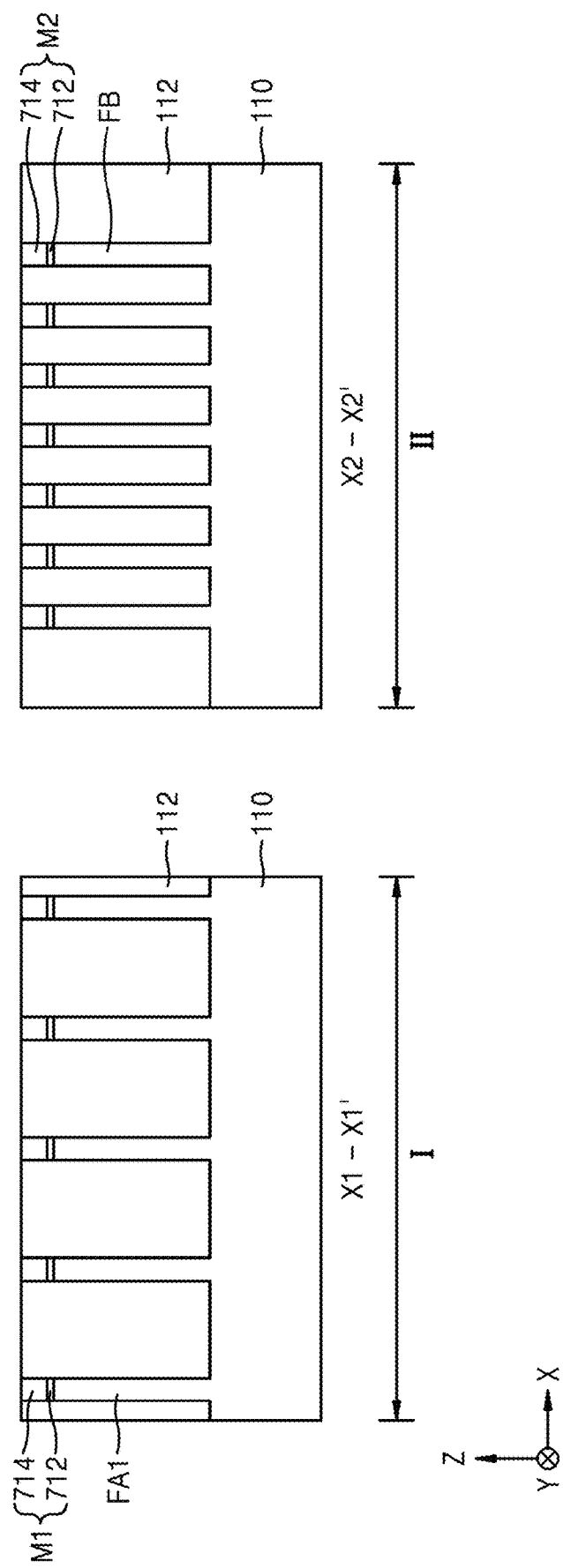

Referring to FIGS. 11A and 11B, in the first area I and the second area II, a device isolation layer 112 that fills spaces between the plurality of fin type active areas FA and the plurality of third fin type active areas FB is formed. After forming the device isolation layer 112, an upper surface of the device isolation layer 112 may be planarized so that the plurality of hard mask patterns 714 are exposed. At this time, parts of the plurality of hard mask patterns 714 are removed so that heights of the plurality of hard mask patterns 714 may be reduced. After the device isolation layer 112 is formed, the plurality of fin type active areas FA and the plurality of third fin type active areas FB may be covered with the plurality of first and second mask patterns M1 and M2. In FIG. 11A, for convenience sake, the plurality of first and second mask patterns M1 and M2 are not shown and the plurality of fin type active areas FA and the plurality of third fin type active areas FB are marked with dotted lines.

Figure 12A:
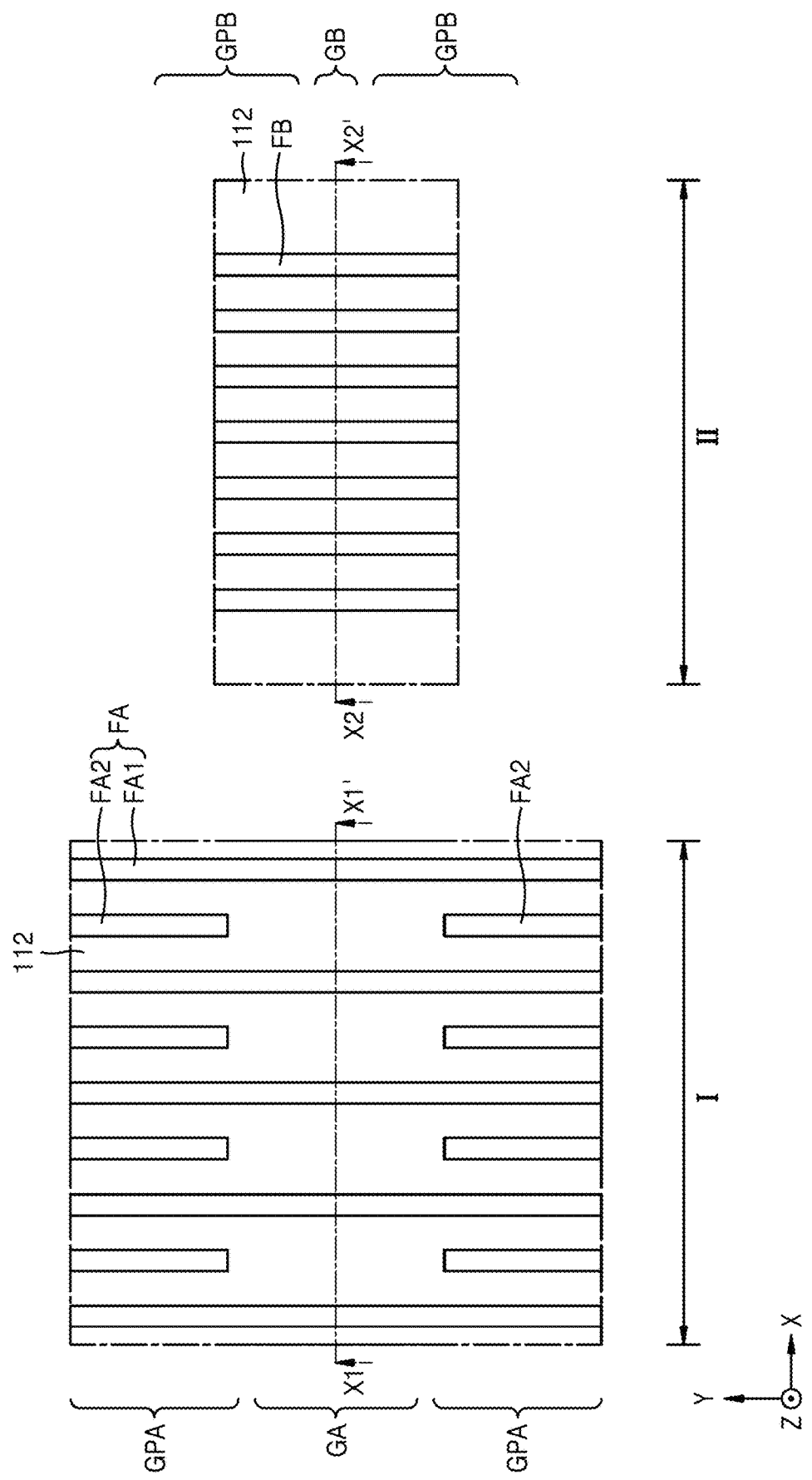
Figure 12B:
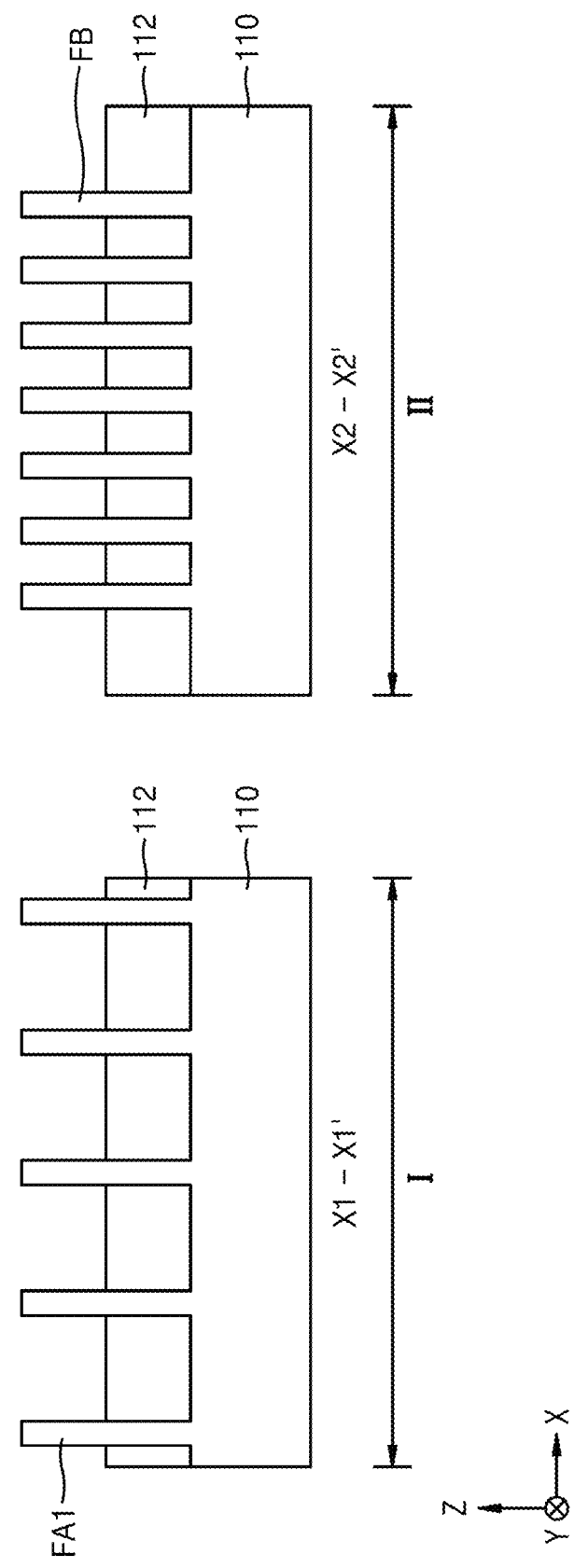

Referring to FIGS. 12A and 12B, by performing a recess process for removing the plurality of first and second mask patterns M1 and M2 and a part of the device isolation layer 112 from the resultant structure of FIGS. 11A and 11B, in the first area I and the second area II, an upper surface and upper side walls of each of the plurality of fin type active areas FA and the plurality of third fin type active areas FB are exposed. In order to perform the recess process of the device isolation layer 112, dry etching, wet etching, or a combination thereof may be used.

After performing the recess process of the device isolation layer 112, in the first area I and the second area II, a height of the upper surface of the device isolation layer 112 is reduced and an upper portion of each of the plurality of fin type active areas FA and the plurality of third fin type active areas FB may protrude above the device isolation layer 112. The device isolation layer 112 may surround lower side walls of each of the plurality of fin type active areas FA and the plurality of third fin type active areas FB.

Figure 13A:
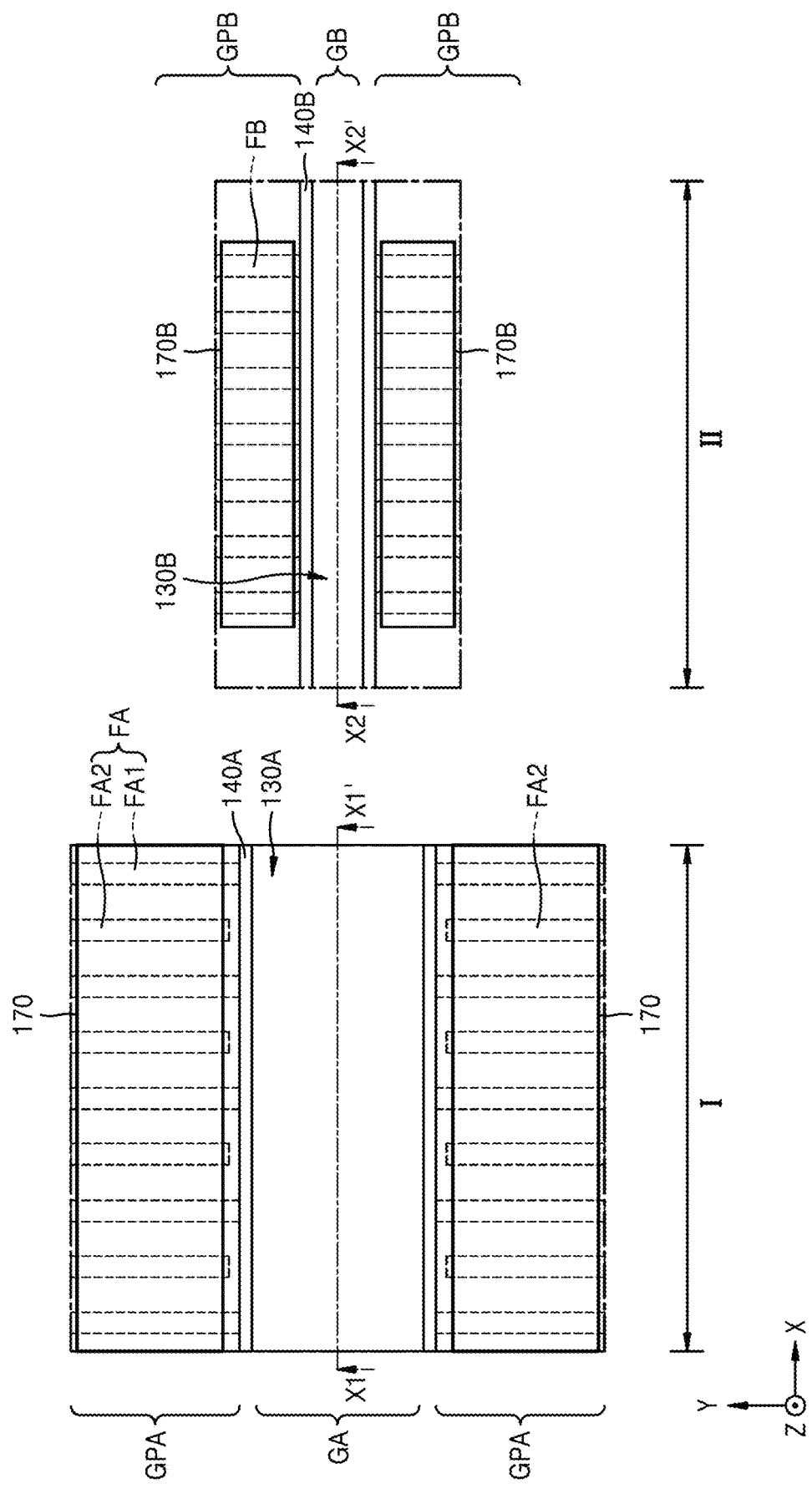
Figure 13B:
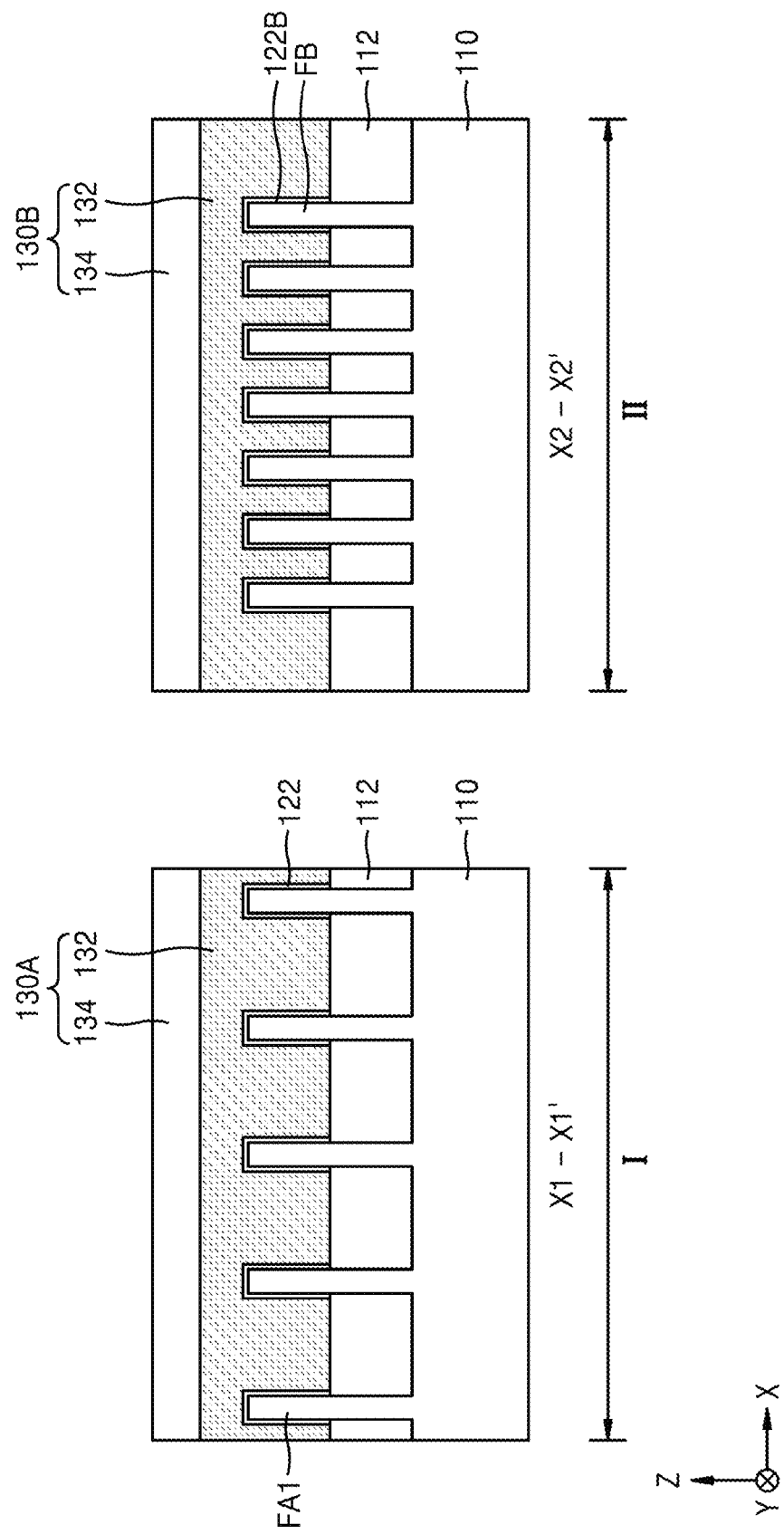

Referring to FIGS. 13A and 13B, a plurality of first gate insulating layers 122 that cover exposed surfaces of the plurality of fin type active areas FA are formed in the first area I and a plurality of first gate insulating layers 122B that cover exposed surfaces of the plurality of third fin type active areas FB are formed in the second area II. In FIG. 13A, for convenience sake, the plurality of fin type active areas FA and the plurality of third fin type active areas FB are marked with dotted lines and the plurality of first gate insulating layers 122 and 122B are not shown.

Processes of forming the plurality of first gate insulating layers 122 and 122B may be simultaneously performed. The plurality of first gate insulating layers 122 and 122B may not cover a surface of the device isolation layer 112. The plurality of first gate insulating layers 122 and 122B may be formed of an oxide layer. In some example embodiments, the plurality of first gate insulating layers 122 and 122B may have a thickness of about 10 Å to about 50 Å. However, the inventive concepts are not limited thereto.

Then, in the gate area GA of the first area I, a first dummy line 130A that covers the plurality of fin type active areas FA, the plurality of first gate insulating layers 122, and the device isolation layer 112 and an insulating spacer 140A that covers side walls of the first dummy line 130A are formed, and in the gate line area GB of the second area II, a second dummy line 130B that covers the plurality of third fin type active areas FB, the plurality of first gate insulating layers 122B, and the device isolation layer 112, and an insulating spacer 140B that covers side walls of the second dummy line 130B are formed. The first and second dummy lines 130A and 130B may be simultaneously formed. The insulating spacers 140A and 140B may be simultaneously formed.

Each of the first and second dummy lines 130A and 130B may include a dummy gate layer 132 and an insulating capping layer 134 that covers the dummy gate layer 132. The dummy gate layer 132 may be formed of a polysilicon layer. The insulating capping layer 134 may be formed of a silicon nitride layer. The insulating spacers 140A and 140B may be formed of a silicon nitride layer.

In the first area I, in the gate peripheral area GPA at both sides of the first dummy line 130A in the Y direction, the pair of source/drain areas 170 are formed. In the second area II, in the gate peripheral area GPB at both sides of the second dummy line 130B in the Y direction, the pair of source/drain areas 170B are formed. The pair of source/drain areas 170 formed in the first area I may be arranged on the plurality of first fin type active areas FA1. The plurality of second fin type active areas FA2 may be connected to the plurality of first fin type active areas FA1 and the plurality of second fin type active areas FA2. The pair of source/drain areas 170B formed in the second area II may be arranged on the plurality of third fin type active areas FB and may be connected to the plurality of third fin type active areas FB. The plurality of source/drain areas 170 and 170B may be simultaneously formed. In FIG. 13A, one source/drain area 170B is illustrated as being connected to the plurality of third fin type active areas FB in the second area II. However, the inventive concepts are not limited thereto. According to an example embodiment, a plurality of source/drain areas in the second area II may be connected to only one third fin type active area FB. Although not shown, in the first area I and the second area II, an etching stop layer that covers at least parts of upper surfaces of the plurality of source/drain areas 170 and 170B may be formed. The etching stop layer may be formed of a silicon nitride layer.

Figure 14A:
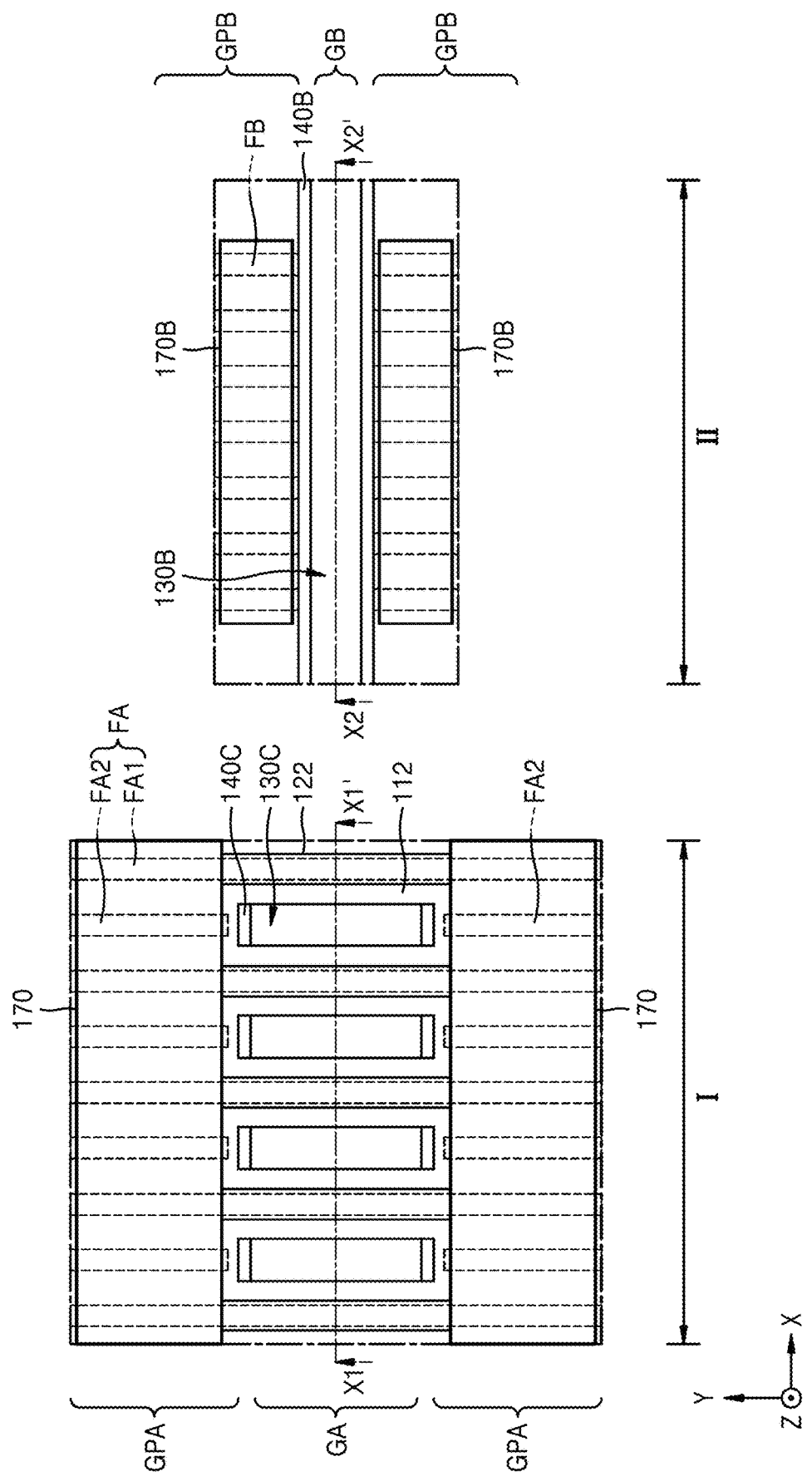
Figure 14B:
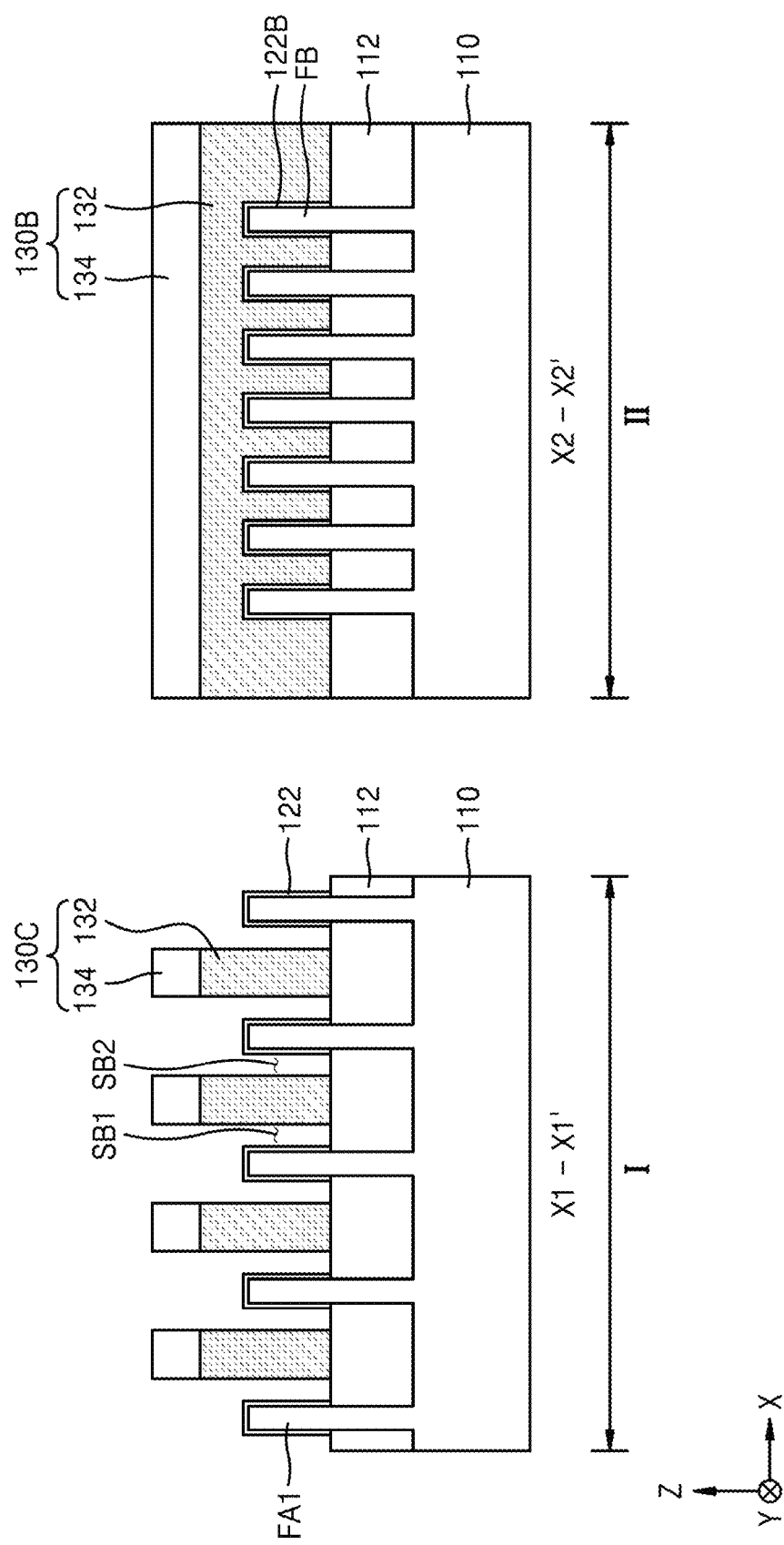

Referring to FIGS. 14A and 14B, a photoresist pattern (not shown) that exposes parts of the first dummy line 130A and the insulating spacer 140A is formed on the resultant structure of FIGS. 13A and 13B. The photoresist pattern may completely cover the second area II and other parts excluding portions to be etched of the first dummy line 130A and the insulating spacer 140A in the first area I. In the first area I, in the first dummy line 130A and the insulating spacer 140A, portions exposed through the photoresist pattern may include portions that perpendicularly overlap the plurality of first fin type active areas FA1.

By etching the exposed portions of the first dummy line 130A and the insulating spacer 140A by using the photoresist pattern as an etching mask, a plurality of first dummy patterns 130C and a plurality of insulating spacer patterns 140C are formed. The plurality of first dummy patterns 130C may include portions left after etching the dummy gate layer 132 and portions left after etching the insulating capping layer 134. The plurality of first dummy patterns 130C may be arranged to be apart from the plurality of first fin type active areas FA1 in a horizontal direction and between the plurality of first fin type active areas FA1. After the plurality of first dummy patterns 130C are formed, the plurality of first gate insulating layers 122 that cover the plurality of first fin type active areas FA1 and the upper surface of the device isolation layer 112 may be exposed between the plurality of first dummy patterns 130C. In some example embodiments, at least parts of the plurality of first gate insulating layers 122, which is exposed during an etching process for forming the plurality of first dummy patterns 130C and the plurality of insulating spacer patterns 140C, may be damaged by an etching atmosphere. In this case, damaged first gate insulating layers 122 may be heated to cure the damaged first gate insulating layers 122, or damaged first gate insulating layers 122 may be removed and a new plurality of first gate insulating layers 122 may be formed.

Then, by removing the photoresist pattern, upper surfaces of the plurality of first dummy patterns 130C and the plurality of insulating spacer patterns 140C may be exposed. In the first area I, at both sides of each of the plurality of first dummy patterns 130C, a first space SB1 and a second space SB2 that expose the upper surface of the device isolation layer 112 may be left.

Figure 15A:
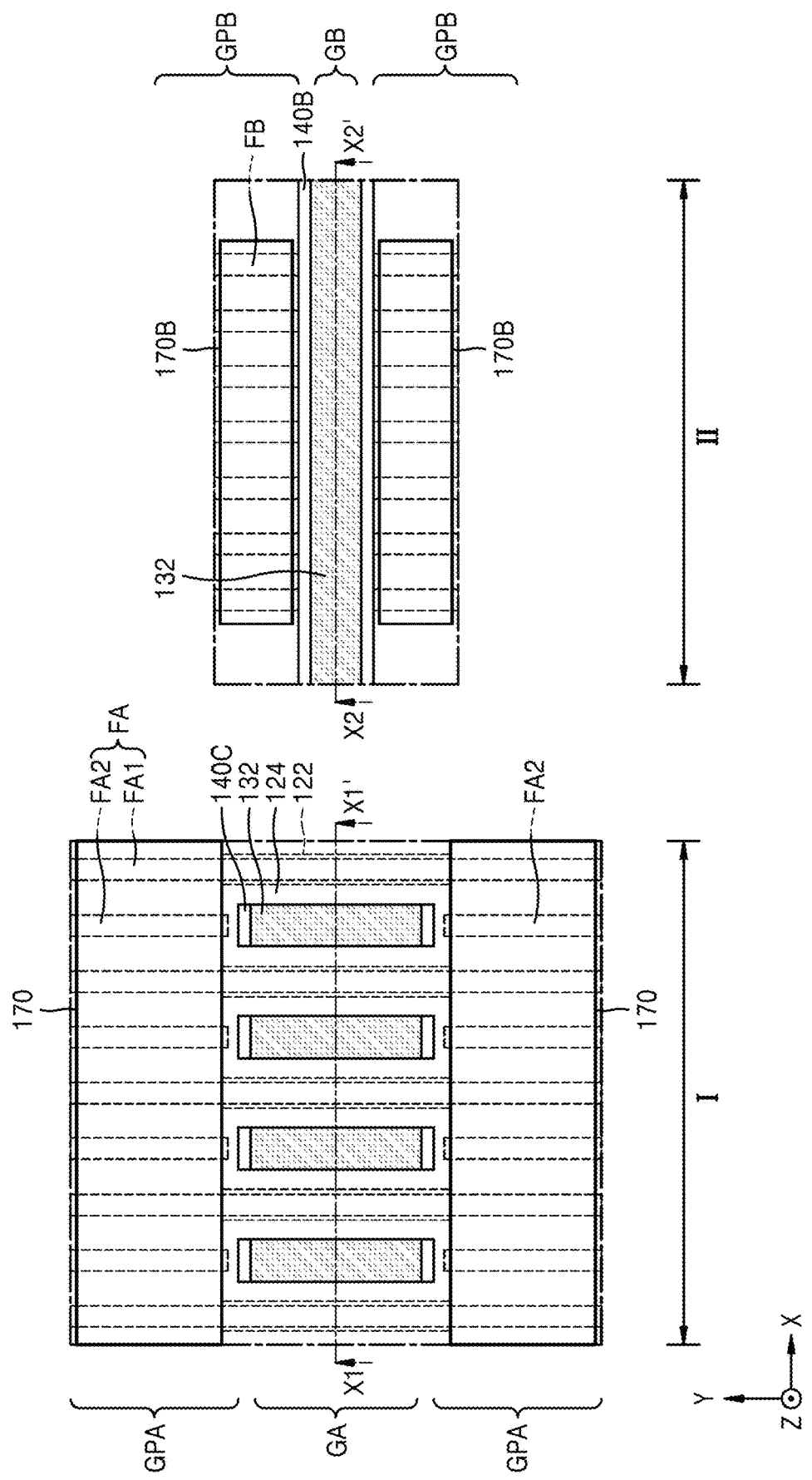
Figure 15B:
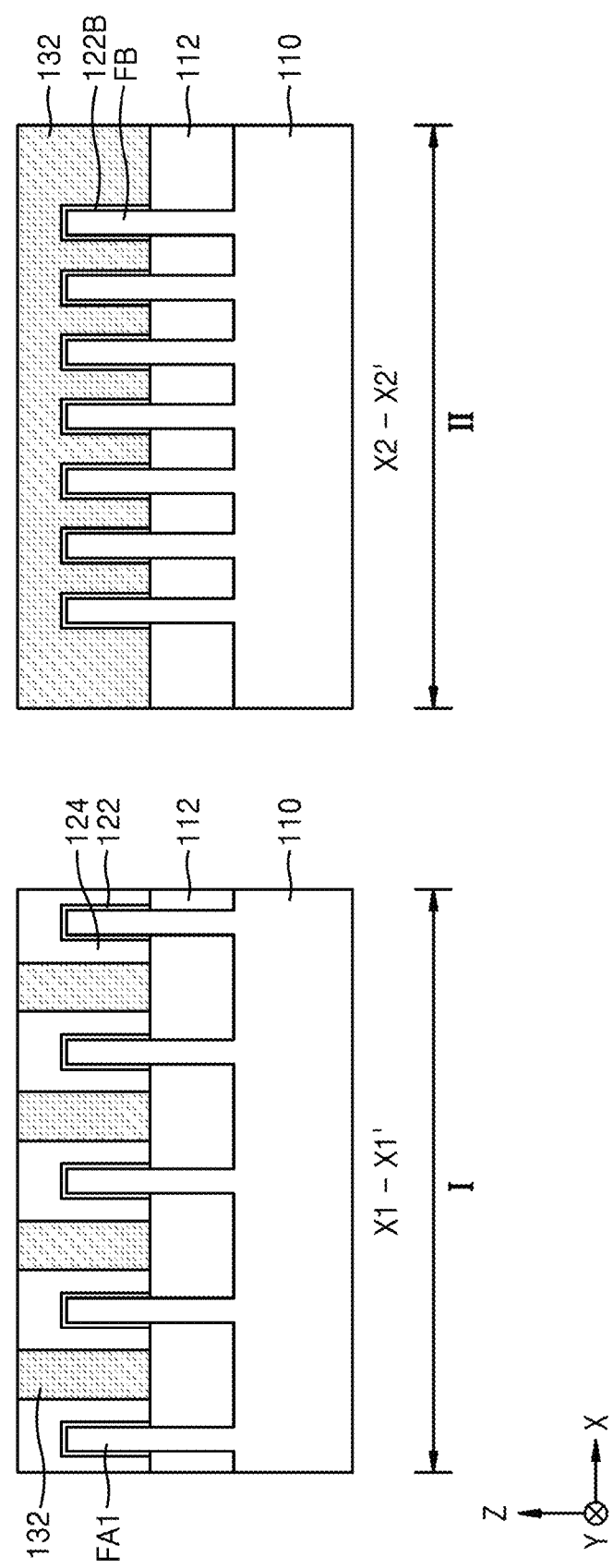

Referring to FIGS. 15A and 15B, in the resultant structure of FIGS. 14A and 14B, the gap-fill gate insulating layer 124 that fills the first space SB1 and the second space SB2 in the first area I and covers the first gate insulating layer 122 on an upper surface of each of the plurality of first fin type active areas FA1 is formed. The gap-fill gate insulating layer 124 may be formed of an oxide layer. In some example embodiments, in order to form the gap-fill gate insulating layer 124, a flowable chemical vapor deposition (FCVD) process may be used.

Then, in the first area I and the second area II, by removing the plurality of insulating capping layers 134 so that the plurality of dummy gate layers 132 are exposed, and by planarizing the obtained resultant structure, an upper surface of each of the plurality of dummy gate layers 132, an upper surface of each of the plurality of insulating spacer patterns 140C, and an upper surface of the gap-fill gate insulating layer 124 may extend on the same plane.

Figure 16A:
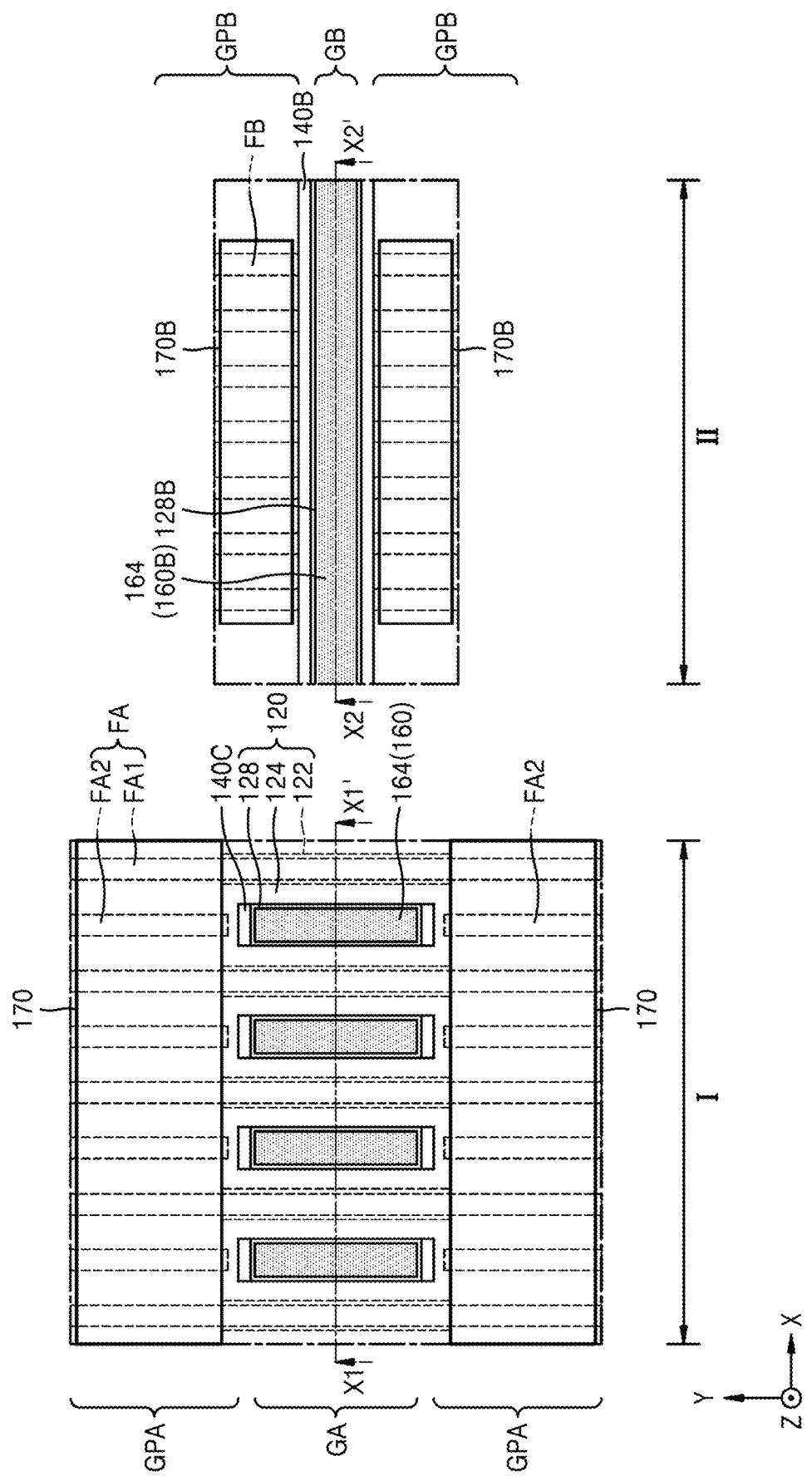

Referring to FIGS. 16A and 16B, in the first area I, each of the plurality of dummy gate layers 132 is replaced by a stack structure of the second gate insulating layer 128 and a gate layer 164 and, in the second area II, each of the plurality of dummy gate layers 132 is replaced by a stack structure of the second gate insulating layer 128B and the gate layer 164.

For this purpose, first, in each of the first area I and the second area II, the plurality of dummy gate layers 132 may be removed. In the first area I, through spaces from which the plurality of dummy gate layers 132 are removed, the gap-fill gate insulating layer 124 may be exposed. Then, in the first area I, in the spaces from which the plurality of dummy gate layers 132 are removed, the second gate insulating layer 128 and the gate layer 164 may be sequentially formed. In the second area II, in the spaces from which the plurality of dummy gate layers 132 are removed, the second gate insulating layer 128B and the gate layer 164 may be sequentially formed. In the first area I, the second gate insulating layer 128 may be formed to contact the gap-fill gate insulating layer 124.

In the first area I and the second area II, the second gate insulating layer 128 and the second gate insulating layer 128B may be simultaneously formed. In the first area I and the second area II, the gate layers 164 may be simultaneously formed. In the first area I, the plurality of gate layers 164 may configure the plurality of gates 160. In the second area II, the plurality of gate layers 164 may configure the gate line 160B. A material of the plurality of gate layers 164 is the same as that of the plurality of gates 160 described with reference to FIGS. 1A to 1C. An upper surface of each of the plurality of gates 160 and the gate line 160B, an upper surface of each of the plurality of second gate insulating layers 128 and 128B, and the upper surface of the gap-fill gate insulating layer 124 may be planarized and may extend on the same plane.

Figure 17A:
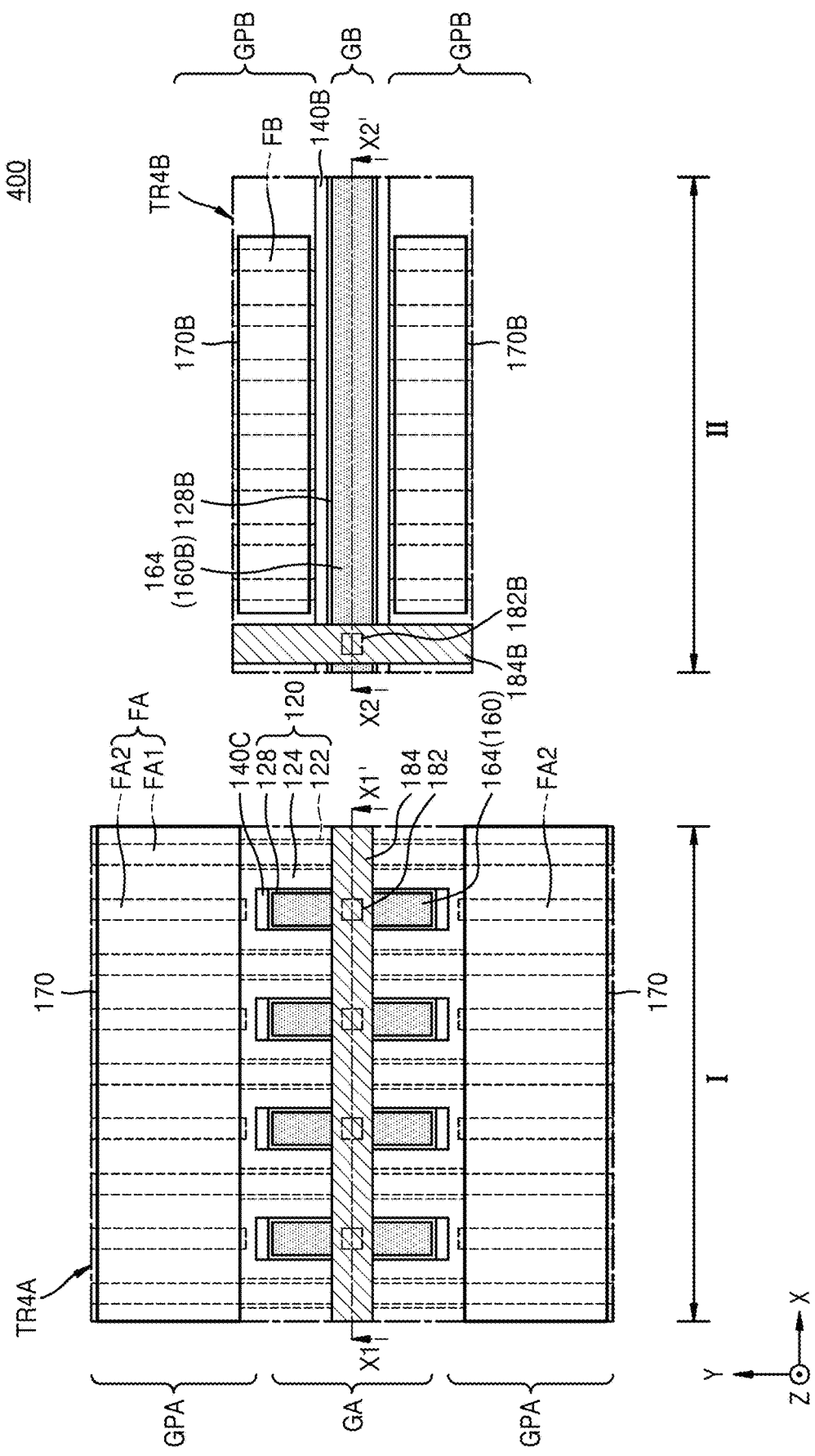
Figure 17B:
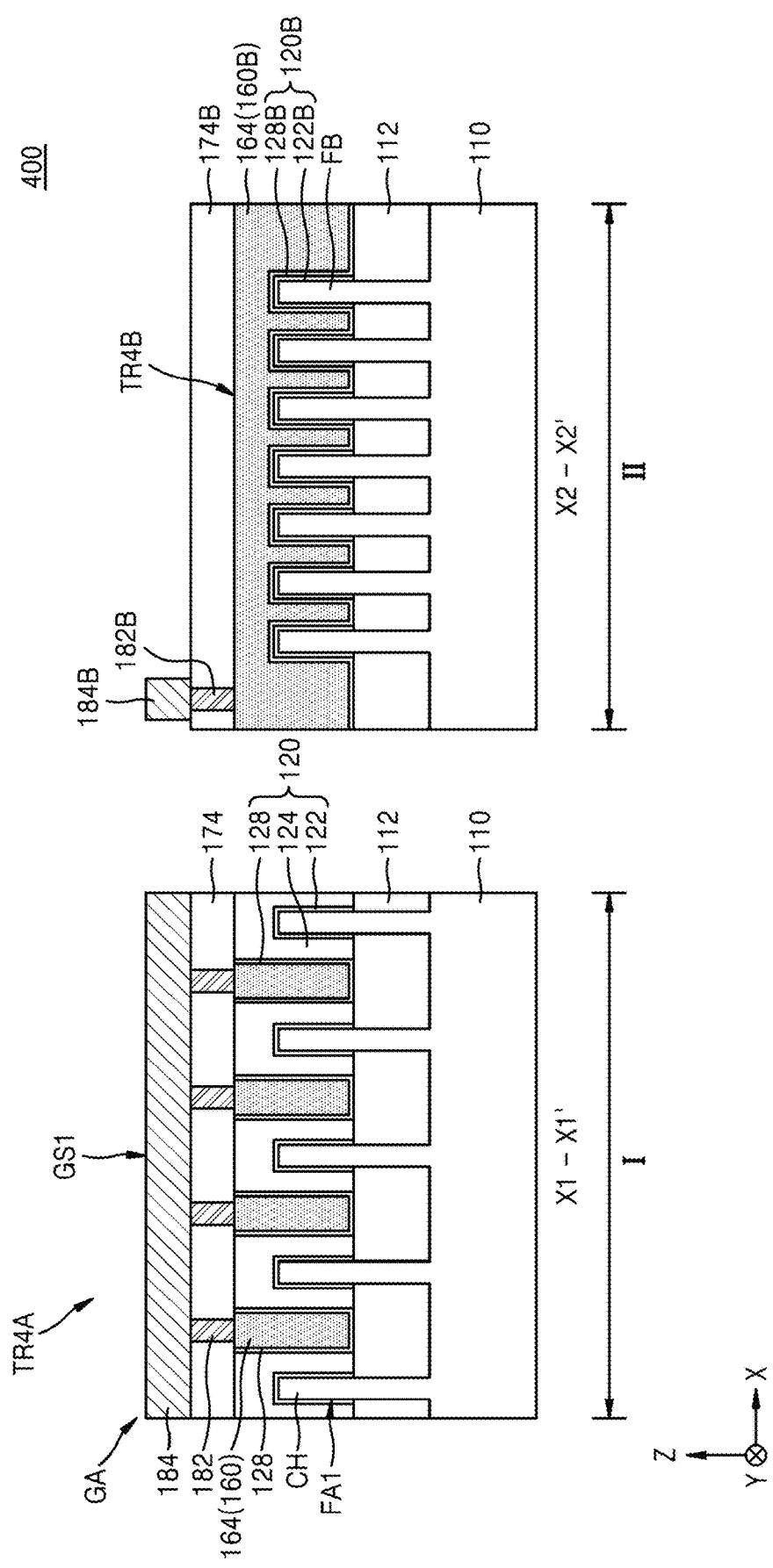

Referring to FIGS. 17A and 17B, on the resultant structure of FIGS. 16A and 16B, insulating layers 174 and 174B and a plurality of gate contacts 182 and a gate line contact 182B that pass through the insulating layers 174 and 174B are formed and, on the plurality of gate contacts 182 and the gate line contact 182B, metal wiring layers 184 and 184B are formed. The metal wiring layers 184 and 184B may be formed at the same level on the substrate 110. Here, the term "level" means a distance from an upper surface of the substrate 110 in a vertical direction (a Z direction or a −Z direction). The insulating layers 174 and 174B may be simultaneously formed. The plurality of gate contacts 182 and the gate line contact 182B may be simultaneously formed. The metal wiring layers 184 and 184B may be simultaneously formed.

In the method of manufacturing the integrated circuit device described with reference to FIGS. 9A and 17B, processes of forming the first transistor TR4A of a high voltage transistor to which a high operating voltage is applied in the first area I and forming the second transistor TR4B of a low voltage transistor to which a low operating voltage is applied in the second area II may be simultaneously performed. Therefore, manufacturing processes of various transistors that desire various operating voltages may be simplified by forming the first transistor TR4A in the first area I, by minimizing processes added to manufacturing processes of the second transistor TR4B in the FinFET structure formed in the second area II, compatibility with processes of forming a transistor in the FinFET structure may increase. Therefore, when the integrated circuit device in which the low voltage transistor and the high voltage transistor are mixed with each other is manufactured, productivity may increase, and a size of a chip including the integrated circuit device according to some example embodiments of the inventive concepts may be reduced by reducing an area occupied by the high voltage transistor.

Further, in forming the first transistor TR4A that is the high voltage transistor in the first area I, as described with reference to FIGS. 14A and 14B, when an etching process for forming a first dummy pattern 130C is performed, by properly selecting a width of the first dummy pattern 130C in the X direction, widths of the first space SB1 and the second space SB2 left between the first dummy pattern 130C and the first fin type active area FA1 in the X direction may be determined to vary. Therefore, in a subsequent process, a thickness of the gap-fill gate insulating layer 124 that fills the first space SB1 and the second space SB2 in the X direction may be easily controlled as desired. Therefore, a process for implementing various transistors that require various operating voltages on one substrate may be simplified.

Referring to FIGS. 9A to 17B, an example method of manufacturing the integrated circuit device 400 illustrated in FIGS. 4A to 4C is described. However, by applying various modifications and changes within the scope of the inventive concepts, the integrated circuit devices 100, 200, 300, 500, and 600 illustrated in FIGS. 1A to 3 and 5A to 6B or various integrated circuit devices having structures similar to those of the integrated circuit devices 100, 200, 300, 500, and 600 may be manufactured.

In some example embodiments, in order to manufacture the integrated circuit device 100 illustrated in FIGS. 1A to 1C and the integrated circuit device 200 illustrated in FIG. 2, processes performed in the first area I in the method of manufacturing the integrated circuit device 400 described with reference to FIGS. 9A to 17B may be used. For example, in order to manufacture the integrated circuit device 200 illustrated in FIG. 2, after performing processes described with reference to FIGS. 9A to 15B and removing the plurality of dummy gate layers 132 in the process described with reference to FIGS. 16A and 16B, before forming the second gate insulating layer 128 and the gate layer 164 in the first area I, by etching the device isolation layer 112 exposed through the spaces from which the plurality of dummy gate layers 132 are removed, the insulating layer 212 in which the plurality of recesses 212R are formed from the device isolation layer 112 as illustrated in FIG. 2 may be formed. Then, in the first area I, on the resultant structure in which the insulating layer 212 is formed, the second gate insulating layer 128 and the gate layer 164 may be formed. Then, the processes described with reference to FIGS. 17A and 17B may be performed.

In some example embodiments, in order to manufacture the integrated circuit device 500 illustrated in FIGS. 5A to 5B and the integrated circuit device 600 illustrated in FIGS. 6A and 6B, the method of manufacturing the integrated circuit device 400 described with reference to FIGS. 9A to 17B may be used. For example, in order to form the plurality of fin type active areas FA5 included in the integrated circuit devices 500 and 600, in the process described with reference to FIGS. 9A and 9B of forming the plurality of first mask patterns M1 in the first area I, a width and pitch of the plurality of first mask patterns M1 may be properly changed. Then, by performing the process described with reference to FIGS. 10A and 10B, the plurality of fin type active areas FA5 including the plurality of first fin type active areas FA51 and the plurality of second fin type active areas FA52 may be formed.

While the inventive concepts have been particularly shown and described with reference to some example embodiments discloses herein, it will be understood that various changes in form and details may be made therein without departing from the spirit and scope of the following claims.

What is claimed is:

1. A method of manufacturing an integrated circuit device, the method comprising:
    forming a pair of fin type active areas to be spaced apart from each other on a substrate in a first horizontal direction, to be parallel with each other, and to extend in a second horizontal direction perpendicular to the first horizontal direction;
    forming a device isolation layer between the pair of fin type active areas to cover lower side walls of each of the pair of fin type active areas;
    forming a dummy pattern to be spaced apart from the pair of fin type active areas on the device isolation layer in the first horizontal direction, to be between the pair of fin type active areas, and to longitudinally extend in parallel with the pair of fin type active areas;
    forming a gap-fill gate insulating layer filling a first space between one of the pair of fin type active areas and the dummy pattern and a second space between the other of the pair of fin type active areas and the dummy pattern;
    removing the dummy pattern; and
    forming a gate in a space from which the dummy pattern has been removed.

2. The method of claim 1, further comprising:
    after forming the device isolation layer, before forming the dummy pattern, forming a first gate insulating layer on the pair of fin type active areas; and
    after removing the dummy pattern, before forming the gate, forming a second gate insulating layer that contacts the gap-fill gate insulating layer in a space from which the dummy pattern has been removed.

3. The method of claim 1, wherein the forming the gap-fill gate insulating layer includes forming the gap-fill gate insulating layer to cover side walls and an upper surface of each of the pair of fin type active areas.

4. The method of claim 1, wherein
    the forming the pair of fin type active areas includes forming each of the pair of fin type active areas to have a first width in the first horizontal direction, and
    the forming the gate includes forming the gate to have a second width greater than the first width in the first horizontal direction.

5. The method of claim 1, further comprising:
    forming a pair of source/drain areas at both sides of the dummy pattern, respectively, in the second horizontal direction and on the pair of fin type active areas,
    wherein the forming the gate is performed after forming the pair of source/drain areas.

6. A method of manufacturing an integrated circuit device, the method comprising:
    forming a plurality of fin type active areas spaced apart from each other in a gate area and a gate peripheral area of a substrate in a first horizontal direction;
    forming a device isolation layer between the plurality of fin type active areas to cover lower side walls of each of the plurality of fin type active areas on the substrate;
    forming a dummy line to cover the plurality of fin type active areas and the device isolation layer, in the gate area;
    forming a pair of source/drain areas at both sides of the dummy line, respectively, to be connected to the plurality of fin type active areas, in the gate peripheral area;
    forming a plurality of dummy patterns to be spaced apart from the plurality of fin type active areas in the first horizontal direction, and to be between the plurality of fin type active areas one by one by removing a part of the dummy line;
    forming a gap-fill gate insulating layer filling spaces between the plurality of fin type active areas and the plurality of dummy patterns;
    exposing the gap-fill gate insulating layer through the spaces from which the plurality of dummy patterns has been removed by removing the plurality of dummy patterns; and
    forming a plurality of gates to longitudinally extend in parallel with the plurality of fin type active areas, in the spaces from which the plurality of dummy patterns has been removed.

7. The method of claim 6, wherein the forming the plurality of fin type active areas includes forming the plurality of fin type active areas to have a first pitch therebetween in the gate peripheral area in the first horizontal direction, and to have a second pitch therebetween in the gate area in the first horizontal direction, the second pitch being greater than the first pitch.

8. The method of claim 6, wherein
    the forming the plurality of fin type active areas includes,
        forming a plurality of first fin type active areas protruding from the substrate in the gate area and the gate peripheral area, and
        forming a plurality of second fin type active areas between the plurality of first fin type active areas one by one in the gate peripheral area, and
    the forming the plurality of gates includes forming each of the gates to be on a straight line with at least a corresponding one of the plurality of second fin type active areas in a second horizontal direction perpendicular to the first horizontal direction.

9. The method of claim 8, wherein the forming the pair of source/drain areas forms the pair of source/drain areas on the plurality of first fin type active areas and the plurality of second fin type active areas.

10. The method of claim 6, further comprising:
forming a plurality of gate contacts on the plurality of gates to be connected to the plurality of gates one by one; and
forming a metal wiring layer connected to the plurality of gate contacts on the plurality of gate contacts.

* * * * *